United States Patent [19]
Orisaka et al.

[11] Patent Number: 6,107,857
[45] Date of Patent: Aug. 22, 2000

[54] LEVEL CONVERTING CIRCUIT

[75] Inventors: Yukihisa Orisaka, Tenri; Hideki Morii, Naga-gun, both of Japan

[73] Assignee: Sharp Kabushiki Kaisha, Osaka, Japan

[21] Appl. No.: 09/012,456

[22] Filed: Jan. 23, 1998

[30]      Foreign Application Priority Data

Sep. 5, 1995  [JP]  Japan ................................... 7-228417
Aug. 8, 1996  [JP]  Japan ................................... 8-210324

[51] Int. Cl.$^7$ ................................................ H03K 17/687
[52] U.S. Cl. ........................ 327/333; 326/62; 326/68
[58] Field of Search ........................... 327/333; 326/62, 326/63, 68, 80, 81

[56]              References Cited

U.S. PATENT DOCUMENTS 5,045,727  9/1991  Danckaert et al. ...................... 326/68
5,296,757  3/1994  Koizumi .................................. 326/62

FOREIGN PATENT DOCUMENTS 53-13852  7/1978  Japan ................................... 327/333
62-29315  2/1987  Japan ................................... 327/333
3-32217   2/1991  Japan ................................... 327/333
62-69719  3/1997  Japan .

*Primary Examiner*—Tuan T. Lam

[57]              ABSTRACT

A level converting circuit converts the level of an input signal to a positive or a negative level according to a power source voltage for supplying a voltage of a reference level for the input signal. In the level converting circuit, a first transistor has a source supplied with a first voltage, and a drain supplied with a second voltage via a loading circuit. Conduction and cutoff of the first transistor is determined on the basis of the signal level of an input signal supplied via a signal input terminal. The drain voltage is supplied as a signal to an output circuit. The output circuit is supplied via a power source terminal with a third voltage, and via another power source terminal with a fourth voltage. Conduction and cutoff of a transistor of the output circuit is determined on the basis of the signal level of the signal supplied to the output circuit, and the third and fourth voltages are selectively outputted as an output signal of the output circuit.

16 Claims, 31 Drawing Sheets

LEVEL CONVERTING CIRCUIT

BACKGROUND OF THE INVENTION

1. Field of the Invention

The present invention relates to a level converting circuit for converting the level of an input signal into a different level.

2. Description of the Background Art

To drive a display element, for example, a display panel composed of liquid crystal, a high voltage is applied to the display element, and desired display is achieved. In the case where the display panel is an active matrix type display panel, for example, a gate driver and a source driver are provided in order to drive the display panel. If each driver is constituted to have a high breakdown voltage, each transistor in the circuit should have, for example, a double diffusion structure, and as a consequence the constitution of the drive circuit becomes large. To prevent the constitutions of drivers from being enlarged, at the stage of processing signals, the processing of signals is conducted using a relatively low voltage, and the voltage value is changed just before applying the voltage to the display element to drive.

FIG. 34 is a block diagram showing a constitution of a conventional gate driver 11, FIG. 35 is a circuit diagram of a level shifter 13 contained in the gate driver 11, and FIG. 36 is a diagram showing a relation between input and output of the gate driver 11.

As shown in FIG. 34, the gate driver 11 is composed of a shift register 12, a level shifter 13, and an output buffer 14. The gate driver 11 is connected to, for example, n electrodes.

Plural voltages are supplied to the gate driver 11 from a power source circuit (not shown). Since the gate driver 11 is a gate driver for outputting a positive voltage on the basis of a negative voltage or a ground voltage Vss as a reference voltage, voltages VDD and VSS are supplied to the output buffer 14, each composition element is supplied in common with the reference voltage VSS of a negative power source side. The level shifter 13 is supplied with voltages VDD and VSS, and the shift register with voltages VSS and VCC. For example, voltage VDD is 30 V, voltage VCC is 5 V, and voltage VSS is 0 V, namely the ground voltage.

In the shift register 12 are inputted a clock signal CK and a start pulse SP whose signal level is shown in FIG. 36, and every time the clock signal CK is inputted, a signal S1 as shown in FIG. 36 is outputted to the level shifter 13. The high voltages of the clock signal CK and the start pulse SP are set to voltage VCC, and the low voltages thereof to voltage VSS, that is 0 V. The level shifter 13 is a circuit for shifting the level of an input signal and outputting the signal of the shifted level. As a structural example of the level shifter 13, FIG. 35 shows a level converting circuit which is disclosed in Japanese Unexamined Patent Publication JP-A 62-69719 (1987). In the following description, the level converting circuit is described as the level shifter 13.

The level shifter 13 is a circuit which converts an input signal S1 which varies between the voltages VCC and VSS to a signal S2 having an amplitude between the voltages VDD and VSS. The level shifter 13 includes an inverter circuit 16, P-channel MOS (metal oxide semiconductor) transistors Q1, Q2, and N-channel MOS transistors Q3, Q4. The inverter circuit 16 is composed of a P-channel MOS transistor Q5 and an N-channel MOS transistor Q6. In the inverter circuit 16, voltage VSS is supplied to a source of the transistor Q6, and voltage VCC is supplied to a source of the transistor Q5.

A signal fed to the level shifter 13 is supplied to gates of the P-channel MOS transistor Q5 and N-channel MOS transistor Q6 of the inverter circuit 16, and a gate of the N-channel MOS transistor Q4.

The output of the inverter circuit 16, namely the drain voltage of the transistors Q5, Q6 is supplied to a gate of the N-channel MOS transistor Q3 whose threshold is set to about 1 V. A drain of the N-channel MOS transistor Q3 is connected to a drain and a gate of the P-channel MOS transistor Q1, and to a gate of the P-channel MOS transistor Q2.

The sources of the P-channel MOS transistors Q1, Q2 are supplied with voltage VDD predetermined to be a higher level voltage than voltage VCC supplied to the input stage. Voltage VSS is supplied to the sources of the N-channel MOS transistors Q3, Q4. The voltage of an connection point between drains of the N-channel MOS transistor Q4 and the P-channel MOS transistor Q2 is supplied to the output buffer 14 as an output of the level shifter 13. The output of the level shifter 13 is shown as a signal S2 in FIG. 36.

To the level shifter 13 is inputted a signal changing between voltage VCC and voltage VSS, namely a signal having an amplitude of 5 V from the shift register 12. When the level of this signal changes from 5 V to 0 V, the N-channel MOS transistor Q6 is cut off, and the P-channel MOS transistor Q5 is made to conduct. Consequently, from the inverter circuit 16 is outputted voltage VCC, namely 5 V, and the N-channel MOS transistor Q3 determined at a threshold of 1 V is put into conduction state, and the gate potentials of the P-channel MOS transistors Q1, Q2 are lowered and the P-channel MOS transistors Q1, Q2 are set in conduction state. On the other hand, since the input has changed from 5 V to 0 V, the N-channel MOS transistor Q4 whose threshold is set to 1 V is cut off to be high in resistance. Therefore, voltage VDD is outputted from the shift register 13.

Likewise, when the level of the input signal changes from 0 V to 5 V, the P-channel MOS transistor Q5 is put in cutoff state, and the N-channel MOS transistor Q6 is set in conduction state. From the inverter circuit 16 is outputted voltage VSS, namely 0 V, and the N-channel MOS transistor Q3 is cut off and becomes a resistance of a high resistance value. When the N-channel MOS transistor Q3 is cut off, the P-channel MOS transistor Q1, Q2 are also cut off and become a resistance of a high resistance value. When the level of the signal fed into the level shifter 13 is 5 V, the N-channel MOS transistor Q4 is made to conduct. Consequently, from the level shifter 13 is outputted voltage VSS.

The output buffer 14 outputs the output of the level shifter 13 for a predetermined period to each electrode. The output of the output buffer 14 is shown as a signal S3 in FIG. 36.

In the gate driver 11 shown in FIG. 34, since the voltage VSS at the negative power source side is used as the reference voltage so that the positive voltage signal S2 is outputted (positive pour source specification), the level shifter 13 in FIG. 35 could be used, but when the voltage VDD at the positive power source side is used as the reference voltage and the negative voltage signal S7 is outputted (negative power source specification),the level shifter 13 cannot be used.

FIG. 37 shows the constitution of a gate driver 11a of the negative power source specification to which voltage VDD at the positive power source side is supplied in common, FIG. 38 shows a level shifter 17 in the gate driver 11a, and FIG. 39 shows a relation between input and output of the gate driver 11a.

In the gate driver 11a, the level shifter 13 in the gate driver 11 is replaced by a level shifter 17. As for other constituent elements, the gate driver 11a is different from the gate driver 11 only in input voltage, and the components are identified with the suffix "a" and the structural explanation is omitted.

The gate driver 11a is a driver for outputting a negative voltage whose reference voltage is a positive voltage VDD, and hence voltages VDD and VSS are supplied to the output buffer 14a, voltage VDD and voltage VSS are supplied to the level shifter 17, and voltage VDD and voltage VCC are supplied to the shift register 12a. For example, voltage VDD is set to 5 V, voltage VSS to −25 V, and voltage VCC to 0 V.

The level shifter 17 is a circuit which converts an input signal S6 which varies between the voltages VDD and VCC to a signal S7 having an amplitude between the voltages VDD and VSS. The level shifter 17 comprises an inverter circuit 16, P-channel MOS transistors Q11, Q12, and N-channel MOS transistors Q13, Q14. In the level shifter 17, the MOS transistors Q1 to Q4 in the level shifter 13 are respectively replaced by MOS transistors Q11 to Q14 of which conduction types are different from each other, and since the levels of the voltages fed to the respective MOS transistors are different, the output voltages are different. In the inverter circuit 16, voltage VCC is supplied to the source of the transistor Q6, and voltage VDD is supplied to the source of the transistor Q5. Moreover, voltage VDD is supplied to the sources of the P-channel MOS transistors Q11, Q12, and voltage VSS is supplied to the sources of the N-channel MOS transistors Q13, Q14.

A start pulse SP shown in FIG. 39, which is supplied to the shift register 12a has a high voltage of 5 V and a low voltage of 0 V. To the shift register 12a are supplied voltage VDD of 5 V and voltage VCC of 0 V, and when the start pulse SP is inputted, a signal S6 as shown in FIG. 39 is outputted on the basis of the signal level of the start pulse SP. The level shifter 17 outputs a signal S7 shown in FIG. 39 on the basis of an output from the shift register 12a. The output buffer 14a outputs a signal S8 shown in FIG. 39 to each electrode on the basis of the signal level of the signal S7 in a predetermined timing.

Herein, if the power source of the display device which supplies a voltage to the gate driver 11, as shown in FIG. 34, is so constituted that the voltage VSS of a predetermined level of the negative power source side is used as a reference voltage to output a positive voltage (positive power source specification), the level shifter 13 as shown in FIG. 35 may be directly used without modifying, but if the display device, as shown in FIG. 37, is so constituted that the voltage VDD of a predetermined level of the positive power source side is used as a reference voltage to output a negative voltage (negative power source specification), the level shifter 17 inverted in polarity as shown in FIG. 38 is required.

Since the prior art gate drivers 11, 11a are provided with either one of the level shifters 13, 17 which operate by either one of the reference voltages VSS and VDD of the gate drivers 11, 11a, it is necessary to select one from the gate driver 11 or 11a depending on whether the source of the display device outputs a positive voltage or a negative. Since the gate driver 11 or 11a is manufactured selectively according to the constitution of the output of the display device, manufacturing cost reduction by mass production can not be realized. Furthermore, if the gate drivers are provided with the level shifters 13 and 17 in common so as to change over one of the gate drivers to the other of the gate drivers in accordance with the constitution of the source, the gate driver can be used whether a positive voltage or a negative voltage is outputted, however, the constitution of the gate driver is enlarged.

SUMMARY OF THE INVENTION

It is hence an object of the invention to provide a level converting circuit capable of converting the levels of voltages VSS and VDD used as a reference for input signals, to either a positive or a negative level according to a power source voltage to be supplied.

In a first aspect of the invention a level converting circuit for converting an input signal having a first reference voltage level supplied to a signal input terminal T1 so as to have a second reference voltage level, a level of the input signal changing within an amplitude having the first reference voltage level and a predetermined voltage level, comprises:

an input loading element (N1 of FIG. 1 or P1 of FIG. 8, hereinafter referred to in this order);

an input switching element P1, N1 provided with first and second output electrodes and a control electrode, the first output electrode being connected to a power source voltage of a first voltage level V1, the second output electrode being connected to a power source voltage of a second voltage level V2 via the input loading element, and the control electrode being connected to the signal input terminal T1, the input switching element P1, N1 for outputting a signal of the first or second voltage level depending on whether the input signal is of the first reference level or of the predetermined voltage level;

an output switching element 34, 34a, 84 provided with first and second power source terminals 37, 38, a signal output terminal T2 and a control terminal 36, the first power source terminal being supplied with a power source voltage of a third voltage level V3, the second power source terminal being connected to a power source voltage of the second reference level of a fourth voltage level V4 different from the third voltage level V3, and the control terminal being connected to the second output electrode of said input switching element, the output switching element for outputting a signal of the third or fourth level from the signal output terminal depending on whether the voltage level of the signal outputted from the input switching element is of the first or second voltage level.

In an embodiment of FIGS. 1 to 7 according to one concept of the invention, a gate driver 41 for driving a liquid crystal panel 53 is provided with a level converting circuit 31, so that it is possible to obtain not only an operation of a positive power source specification in which a signal S13 having a positive voltage is outputted as shown in FIG. 4A, but also an operation of a negative power source specification in which a signal S18 having a negative voltage is outputted as shown in FIG. 4B. In an embodiment of FIGS. 8 to 10 according to another concept of the invention, a gate driver 41a is provided with a level converting circuit 31a, whereby it is possible to obtain not only an operation of a positive power source specification in which a signal S23 having a positive voltage is outputted as shown in FIG. 4A, but also an operation of a negative power source specification in which a signal S28 having a negative voltage is outputted as shown in FIG. 4B. Embodiments of FIGS. 11 to 33 are constituted according to the concept of the embodiment of FIGS. 1 to 7, however the embodiments of FIGS. 11 to 33 can be modified according to the concept of the embodiment of FIGS. 8 to 10 to embody the invention, which are embraced within the scope of the invention, too.

With respect to the first and second reference voltage levels, in the embodiment of FIGS. 1 to 7 a low level of an input signal SP in FIGS. 4A and 4B is the first reference voltage level (e.g., 0 V), and a low level of signals S11 and S16 is the second reference voltage level, which is denoted by reference character VSS.

The embodiments of FIGS. 8 to 10, a high level of the input signal SP in FIGS. 10A and 10B is the first reference voltage level, for example, 5 V denoted by reference character VLS, and a high level of signals S21 and S26 is the second reference voltage level, which is denoted by reference character VDD.

It should be noted that the reference characters employed herein are for the purpose of facilitating understanding of the invention and not of limitation.

According to the first aspect of the invention, the level converting circuit comprises an input switching element (P1 of FIGS. 1–7 or N1 of FIGS. 8–10, hereinafter referred to in this order), an input loading element N1, P1 and an output switching element N2, P2. The first output electrode of the input switching element P1, N1 is connected to the power source voltage of the first voltage level V1, and the second output electrode is connected to the power source voltage of the second voltage level V2 via the input loading element N1, P1. The second output electrode of the input switching element P1, N1 is connected to the control terminal of the output switching element N2, P2.

An output OUT1 from the second output electrode of the input switching element P1, N1 corresponds to the level of the input signal SP fed to the control electrode via the signal input terminal T1. Depending on whether the level of the input signal SP is the first reference voltage level or the predetermined voltage level, the voltage level of the second output electrode becomes the first voltage level V1 or the second voltage level V2.

The power source voltage of the third voltage level V3 is fed to the first power source terminal 37, 38 of the output switching element 34, 34a, 84, and the power source voltage of the fourth voltage level V4 is fed to the second power source terminal 38 or 37.

The output switching element 34, 34a, 84 outputs a voltage of the third voltage level V3 or the fourth voltage V4 level from the signal output terminal T2, depending on whether the voltage level from the second electrode of the input switching element P1, N2 is the first voltage level V1 or the second voltage level V2.

Therefore the first reference voltage level of the input signal SP can be converted to the second reference voltage level V4 of the voltage outputted from the output switching element 34, 34a, 84.

According to the invention, the input signal having the amplitude including the first reference voltage level supplied to the signal input terminal T1 and the predetermined voltage level is supplied to the control electrode of the input switching element, whereby the input switching element outputs the signal OUT1 having the first voltage level V1 or the second voltage level V2, and the output switching element outputs signals S11, S16; S21, S26 of the third voltage level V3 or the fourth voltage level V4 from the signal output terminal T2 according to the signal OUT1 outputted from the second output electrode by the input switching element. Accordingly the input signal SP having the level of the first reference voltage supplied to the signal input terminal T1 can be converted to the signals S11, 516; 521, S26 having the fourth voltage level V4 as the second reference voltage level. Consequently in the invention, in the case where the first reference voltage level of the input signal SP externally inputted via the signal input terminal T1 is different from the second reference voltage level of a signal required to operate a circuit (in the below-mentioned embodiments, for example, shift registers 42, 42a, level shifters 43, 43, and output buffers 44, 44a in the gate drivers 41, 41a), providing with a level converting circuit 31, 31a makes it possible to operate the circuit. Thereby it is made unnecessary to selectively manufacture the gate drivers 11, 11a referred to in connection with the above-mentioned prior art, depending on constitutions of display apparatus.

In a second aspect of the invention, the input loading element has first and second electrodes and a second control electrode, the first electrode being connected to the power source voltage of the second voltage level, the second electrode being connected to the second output electrode of the input switching element, the second control electrode being connected to the power source voltage of the first or third voltage level.

According to the second aspect of the invention, in an embodiment as shown in FIG. 1, a voltage V5 supplied to the second control electrode of the input loading element N1 is set at the first voltage level V1 higher than the second voltage level V2, for conduction and operation as an input load. In the embodiment of FIG. 8, the third voltage level V3 lower than the second voltage level V2 is selected as the voltage V5 supplied to the second control electrode of the input load P1, for conduction and operation as an input load.

In a third aspect of the invention, said input loading element comprises:

first loading means 102 for operating as an input load when the first reference voltage level is chosen to be equal to the second reference voltage level V1; and second loading means 103 connected in parallel to the first loading means 102 for operating as an input load when the first reference voltage level is different from the second reference voltage level.

According to the third aspect of the invention, as shown in FIGS. 14 to 30, the first and second loading means 102, N11; 103, N12 are connected to the second output electrode of the input switching element in parallel. In cases of the positive power source specification of FIG. 4A and the negative power source specification of FIG. 10B, the first loading means operates when the first reference voltage level is defined to be equal to the second reference voltage level. In the negative power source specification of FIG. 4B and the positive power source specification of FIG. 10A, the second loading means operates when the first reference voltage level is defined to be different from the second reference voltage level. Accordingly either of the first and second loading means operates depending on whether the first reference voltage level is equal to or different from the second reference voltage level, and by differentiating the first loading means from the second loading means in characteristics, the operation of the level converting circuit according to the level of the voltage fed as the third voltage level is achieved.

In a fourth aspect of the invention, a resistance value of said second loading means N12 is larger than a resistance value of said first loading means N11 when the first reference voltage level is chosen to be equal to the second reference voltage level, and the resistance value of said first loading means N11 is larger than the resistance value of said second loading means N12 when the first reference voltage level V3 is chosen to be different from the second reference voltage level.

According to the fourth aspect of the invention, when the first reference voltage level is equal to the second reference voltage level, the resistance value of the second loading means is larger than that of the first loading means. On the other hand, when the first reference voltage level is different from the second reference voltage level, the resistance value of the first loading means is larger than that of the second loading means. Accordingly the resistance values of the first and second loading means are determined depending on whether the first reference voltage level is equal to or different from the second voltage level, and either one of the first and the second loading means operates as a load. By differentiating the first loading means from the second loading means in characteristics, the operation of the level converting circuit depending on the level of the voltage fed as the third voltage level is realized.

In a fifth aspect of the invention, said first loading means 102, N11 is provided with first and second electrodes and a second control electrode, and the first electrode is connected to the power source voltage of the second voltage level V2, the second electrode is connected to the second output electrode of the input switching element PI, and the second control electrode is connected to the power source voltage of the third voltage level V3 (=VCC) to conduct between the first and the second electrodes of the first loading means 102, N11.

According to the fifth aspect of the invention, as shown in FIG. 17, the one output electrode of the load element N11 of the first loading means 102, N11 is connected to the power source voltage of the second voltage level V2, and the another output electrode of the load element of the first loading means is connected to the second output electrode of the input switching element P1. The control electrode of the first loading means is connected to the power source voltage of the third voltage level (V3=VCC, see FIGS. 4A, 4B). The resistance value of the load element of the first loading means in conduction state is larger than that of the input switching element in conduction state, and smaller than that of the input switching element in cutoff state. Accordingly, when the input switching element is in conduction state, the power source voltage of the first voltage level V1 fed to the one output electrode is a voltage to be fed to the control terminal 36 of the output switching element. When the input switching element is in cutoff state, the power source voltage of the second voltage level V2 is a voltage to be fed to the control terminal of the output switching element.

In a sixth aspect of the invention, said second loading means 103, N12 is provided with first and second electrodes and a second control electrode, and the first electrode is connected to the power source voltage of the second voltage level V2, the second electrode is connected to the second output electrode of said input switching element P1, and the second control electrode is connected to the power source voltage of the first voltage level VI (=VLS) to conduct between the first and the second electrodes of the second loading means 103, N12.

According to the sixth aspect of the invention, the one output electrode of the load element N12 of the second loading means 103, N12 is connected to the power source voltage of the second voltage level V2, and the another output electrode is connected to the second output electrode of the input switching element. The control electrode of the second loading means is connected to the power source voltage of the first voltage level V1 (V1=VLS). The resistance value of the load element N12 of the second loading means is larger than that of the input switching element in conduction state, and smaller than that of the input switching element in cutoff state. Accordingly, when the input switching element is in conduction state, the power source voltage of the first voltage level V1 fed to the first output electrode of the input switching element is a voltage to be fed to the control terminal 36 of the output switching element. When the input switching element is in cutoff state, the power source voltage of the second voltage level V2 fed to the another output electrode of the load element of the second loading means is a voltage to be fed to the control terminal 36 of the output switching element.

In a seventh aspect of the invention, said output switching element 34, 34a comprises:
  a switching element (N2 of FIG. 1, P2 of FIG. 8) provided with third and fourth output electrodes and a second control electrode, wherein the third output electrode is connected to the second power source terminal (38 of FIG. 1 or 37 of FIG. 8), the fourth output electrode is connected to the signal output terminal T2, and the second control electrode is connected to the control terminal 36; and
  output loading means (P2 of FIG. 1 or N2 of FIG. 8) connected between the fourth output electrode of said switching element N2, P2 and the first power source terminal 37, 38.

According to the seventh aspect of the invention, as shown in FIGS. 1 to 7 and FIGS. 8 to 10, the output switching element 34, 34a, 84 comprises a switching element (P1 of FIG. 1; N1 of FIG. 8) and output loading means. The switching element has a threshold of a voltage level between the first voltage level V1 and the second voltage level V2. The first output electrode of the switching element is connected to the another power source terminal (38 of FIG. 1; 37 of FIG. 8), the second output electrode of the switching element is connected to the signal output terminal T2, and the control electrode is connected to the control terminal 36. The second output electrode of the switching element is further connected to the one power source terminal (37 of FIG. 1; 38 of FIG. 8) via the output loading element (P2 of FIG. 1; N2 of FIG. 8). The switching element can output alternately the power source voltage of the third or fourth voltage level depending on whether the voltage level of the input signal SP is on the first or the second voltage level V2 side with respect to the threshold of the switching element.

In an eighth aspect of the invention, said output switching element 84 comprises:
  a first switching element P 3 provided with third and fourth output electrodes and a second control electrode, wherein the third output electrode is connected to the first power source terminal 37, the fourth output electrode is connected to the signal output terminal T2, and the second control electrode is connected to the control terminal 36; and
  a second switching element N3 which is a complementary conductive type element to said input switching element P1 and is provided with fifth and sixth output electrodes and a third control electrode, wherein the fifth output electrode is connected to the second power source terminal 38, the sixth output electrode is connected to the signal output terminal T2, and the third control electrode is connected to the control terminal 36.

According to the eighth aspect of the invention, as shown in FIG. 11, the output switching element comprises one and another switching elements P3 and N3, the one switching element P3 is of the same conductive type as that of the input switching element, and the another switching element N3 is of a complementary type with respect to the type of the input switching element. The one output electrode of the one switching element P3 is connected to the one power source terminal 37, and the another output electrode of the one switching element P3 is connected to the signal output terminal T2. One output electrode of the another switching element N3 is connected to the another power source terminal 38, and the another output electrode of the another switching element is connected to the signal output terminal T2. The control electrodes of the one and another switching elements P3 and N3 are both connected to the control terminal 36. Accordingly, on the basis of the voltage level at the another output electrode of the input switching element of the voltage supplied via the control terminal to each control electrode of the output switching element, either the one P3 or the another switching element N3 is put into conduction state to output to the signal output terminal T2. Accordingly conduction between the one and the another power source terminal to which power source voltages of different voltage levels are fed is prevented, current flow through the output switching element 84 can be reduced.

In a ninth aspect of the invention, said output switching element comprises:

- a first switching element P 4 which is a same conductive type element as said input switching element P1 and is provided with third and fourth output electrodes and a second control electrode, wherein the third output electrode is connected to the power source voltage of the first voltage level V1 and the second control electrode is supplied with a voltage of the reference voltage level GND of the input signal SP, so that said first switching element P4 is continuously in conduction state;
- a second switching element N4 which is a complementary conductive type element to the first switching element P4 and is provided with fifth and sixth output electrodes and a third control electrode, wherein the fifth output electrode is connected to the power source voltage of the second voltage level V2, the sixth output electrode is connected to the fourth output electrode of said first switching element P4, and the third control electrode is connected to the control terminal 36; and
- a bridge circuit including third and fourth switching element P5, P6 of the same conductive type as said first switching element P4 each having respective seventh and eighth output electrodes and a respective control electrode and fifth and sixth switching elements N5, N6 of the same conductive type as said second switching element N4 each having respective ninth and tenth output electrodes and a respective control electrode, wherein the ninth output electrode of each of the fifth and sixth switching element N5, N6 are connected to the second power source terminal 38, the seventh output electrode of each of the third and fourth switching elements P5, P6 are connected to the first power source terminal 37, the eighth and tenth output electrodes of the third and fifth switching elements P5, N5 and the control electrode of the fourth switching element P6 are connected in common, the eighth and tenth output electrodes of the fourth and sixth switching elements P6, N6 and the control electrode of the third switching element P5 are connected in common to the signal output terminal T2, the control electrode of the sixth switching element N6 is connected to the fourth output electrode of said first switching element P4, and the control electrode of the fifth switching element N5 is connected to the control terminal 36.

According to the ninth aspect of the invention, as shown in FIG. 12, the output switching element comprises a first switching element P4 of the same conduction type as that of the input switching element, a second switching element N4 of a complementary conductive type with respect to the type of the input switching element, and a bridge circuit. The respective another output electrodes of the first and second switching elements P4 and N4 are connected in common to the control electrode of the sixth switching element. The one output electrode of the first switching element P4 is connected to the power source voltage of the first voltage level V1. The control electrode is supplied with the voltage of the reference level of the input signal, and is continuously in conduction state. The second switching element N4 has a threshold between the first voltage level V1 and the second voltage level V2. The one output electrode of the second switching element N4 is connected to the power source voltage of the second voltage level V2, and the control electrode is connected to the control terminal. The bridge circuit is composed of third and fourth switching elements P5 and P6 of the same conduction type as that of the first switching element P4 and fifth and sixth switching elements N5 and N6 of the same conduction type as that of the second switching element N4. The one output electrode of each of the fifth and sixth switching elements N5 and N6 is connected to the another power source terminal, and the one output electrode of each of the third and fourth switching elements P5 and P6 is connected to the one power source terminal. The another output electrode of each of the third and fifth switching elements and the control electrode of the fourth switching element are connected in common. The another output electrode of each of the fourth and sixth switching elements and the control electrode of the third switching element are connected in common to the signal output terminal.

Accordingly, since the voltage level of the another output electrode of the input switching element P1 is converted in the first and second switching elements P4 and N4, and the level of a voltage outputted from the bridge circuit is determined by the voltage level V1 of the output electrode of the input switching element P1 and the converted voltage level, conduction between the one 37 and the another power source terminal 38 which are supplied with power source voltages of different voltage levels is prevented, so that current flow through the output switching element 94 can be reduced.

In a tenth aspect of the invention, a level converting circuit for converting an input signal SP having a first reference level supplied to a single input terminal T 1 into an output signal having a second reference level comprising:

- an input switching element (P1 of FIG.1 or N1 of FIG. 8 ) of a first conductive type having first and second electrodes and a first control electrode, the first control electrode being coupled to the input signal SP and the first electrode being coupled to a first voltage level V1;
- an input loading element N1, P1 of a second conductive type opposite the first conductive type and having third and fourth electrodes and a second control electrode, the second control electrode being coupled to a control voltage level V5, the third electrode being coupled to the second electrode of said input switching element P1, N1 and the fourth electrode being coupled to a second voltage level V2;
- an output loading element P2, N2 of the first conductive type having fifth and sixth electrodes and a third control electrode, the fifth electrode being coupled to a third voltage level V3 and the sixth electrode being coupled to an output terminal T2 of the level converting circuit; and an output switching element N2, P2 of the second conductive type having seventh and eighth electrodes and a fourth control electrode, the fourth control electrode being coupled to the second electrode of said input switching element P1, N1, the seventh electrode being coupled to the output -terminal T2, and the eighth electrode being coupled to a fourth voltage level V4, the third control electrode of said output loading element P2, N2 being coupled to a sixth voltage level V6, the input signal SP switching between the first and second voltage levels V1, V2 with the first reference level (0 V) therebetween and the output signal OUT being provided along the output terminal T2 as switching between the third and fourth voltage levels V3, V4 with the second reference level (VSS or VDD) therebetween.

In an eleventh aspect of the invention, a level converting circuit for converting an input signal having a first reference level supplied to a signal input terminal into an output signal having a second reference level (VSS of FIG. 4 or VDD of FIG. 10) comprising:

an input switching element having first and second electrodes and a first control electrode, the first control electrode being coupled to the input signal and the first electrode being coupled to a first voltage level;

an input loading element (N1 of FIG. 1 or P1 of FIG. 8) having third and fourth electrodes and a second control electrode, the second control electrode being coupled to a control voltage level, the third electrode being coupled to the second electrode of said input switching element P1, N1 and the fourth electrode being coupled to a second voltage level; and an output switching element 34, 34a having first and second power terminals 37, 38, a control terminal 36 and an output terminal T2, the control terminal being coupled to the second electrode of said input switching element, the first power terminal ( 37 of FIG. 1 or 38 of FIG. 8 ) being coupled to a third voltage level and the second power terminal ( 38 of FIG. 1 or 37 of FIG. 8 ) being coupled to a fourth voltage level, the input signal switching between the first and second voltage levels with the first reference level therebetween and the output signal being provided along the output terminal as switching between the third and fourth voltage levels with the second reference level therebetween.

In a twelfth aspect of the invention, said output switching element comprises:

a first switching element (P2 of FIG. 1 or N2 of FIG. 8 ) having fifth and sixth electrodes and a third control electrode, the fifth electrode being coupled to the first power terminal ( 37 of FIG. 1 or 38 of FIG. 8 ), the sixth electrode being coupled to the output terminal and the third control terminal being coupled to a fifth voltage V6 level; and a second switching element (N2 of FIG. 1 or P2 of FIG. 8 ) having seventh and eighth electrodes and a fourth control electrode, the seventh electrode being coupled to the output terminal, the eighth electrode being coupled to the second power terminal and the fourth control electrode being coupled to the control terminal 36.

In a thirteenth aspect of the invention, said input switching element (P1 of FIG. 1 or N1 of FIG. 8 ) and said first switching element are of a first conductive type and said input loading element (N1 of FIG. 1 or P1 of FIG. 8 ) and said second switching element are of a second conductive type opposite the first conductive type.

In a fourteenth aspect of the invention, said output switching element 84 comprises:

a first switching element P3 having fifth and sixth electrodes and a third control electrode, the fifth electrode being coupled to the first power terminal, the sixth electrode being coupled to the output terminal and the third control terminal being coupled to the control terminal; and a second switching element N3 having seventh and eighth electrodes and a fourth control electrode, the seventh electrode being coupled to the output terminal, the eighth electrode being coupled to the second power terminal and the fourth control electrode being coupled to the control terminal.

In a fifteenth aspect of the invention, said input switching element and said first switching element are of a first conductive type and said input loading element and said second switching element are of a second conductive type opposite the first conductive type.

In a sixteenth aspect of the invention, said output switching element comprises:

a first switching element P4 having fifth and sixth electrodes and a third control electrode, the fifth electrode being coupled to the first voltage level and the third control electrode being coupled to system ground GND;

a second switching element N4 having seventh and eighth electrodes and a fourth control electrode, the seventh electrode coupled to the sixth electrode of said first switching element, the eighth electrode being coupled to the second voltage level and the fourth control electrode being coupled to the control terminal;

third and fourth switching elements P5, P6 each having respective ninth and tenth electrodes and a control electrode, the ninth electrodes each being coupled to the first power terminal 37; and fifth and sixth switching elements N5, N6 each having respective eleventh and twelfth electrodes and a control electrode, the twelfth electrodes each being coupled to the second power terminal 38; and the control electrode of said fifth switching element being coupled to the control terminal 36, the tenth and eleventh electrodes of said third and fifth switching elements P5, N5 and the control electrode of said third switching element P6 being coupled together, and the tenth and eleventh electrodes of said fourth and sixth switching elements P6, P6 and the control electrode of said fourth switching element P5 being coupled together to the output terminal.

In a seventeenth aspect of the invention, said input switching element, said first switching element and said third and fourth switching elements are of a first conductive type and said input loading element, said second switching element and fifth and sixth switching elements are of a second conductive type opposite the first conductive type.

According to the invention, it is possible to convert the input signal SP having a first reference voltage level to the output signal having a second reference voltage level, and the second reference voltage level V4 can be set, for example, as VSS (FIGS. 1 to 7 ) or VDD (FIGS. 8 to 10 ) which is to be supplied to the output switching elements 34, 34a, 84.

Further, according to the invention, the first loading means 102, N11 operate in the case where the first reference level is set to be equal with the second reference level under the positive power supply specification of FIG. 4A and negative power supply specification of FIG. 10B. And the second loading means 103, N12 operate in the case where the voltage level of the first reference level is set to be different from that of the second reference level under the negative power supply specification of FIG. 4B and the positive power supply specification of FIG. 10A. Accordingly, by making the characteristics of the first and second loading means different from each other, it is possible to operate the level converting circuit according to the voltage levels supplied to the control electrodes of the first and second loading means as the first or third voltage level, for example.

Furthermore, according to the invention, in the case where the first reference voltage level is selected to be equal with the second reference voltage level, the resistance value of the second loading means is set to be larger than that of the first loading means, while in the case where the voltage levels of the first reference voltage level and the second reference voltage level are different from each other, the resistance value of the first loading means is set to be larger than that of the second loading means. Accordingly the resistance values of the first and second loading means are determined depending on the first or third voltage level V3, and either one of the first and the second loading means operates as a load. By differentiating the first loading means from the second loading means in characteristics, it is possible to operate the level converting circuit according to the level of a voltage fed to the control electrodes of the first and second loading means as the first or third voltage level.

Furthermore, according to the invention, since the resistance value of the first loading means 102, N11 whose control electrode is supplied with the power source voltage of e.g. the first voltage level so as to be continuously in conduction state is defined to be larger than that of the input switching element in conduction state, and smaller than that of the input switching element in cutoff state, it is possible to supply the control terminal of the output switching element with the power source voltage of the first voltage level,, fed to the one output electrode of the input switching element, when the input switching element lies in conduction state, and with the power source voltage of the second voltage level, fed to the another output electrode of the load element of the first loading means, when the input switching element lies in cutoff state.

Furthermore, according to the invention, since the resistance value of the second loading means 103, N12 whose control electrode is supplied with the power source voltage of e.g. the first voltage level so as to be continuously in conduction state is defined to be larger than that of the input switching element in conduction state, and smaller than that of the input switching element in cutoff state, it is possible to supply the control terminal 36 of the output switching element with the power source voltage of the first voltage level, fed to the one output electrode of the input switching element, when the input switching element P1 lies in conduction state, and with the power source voltage of the second voltage level V2, fed to the another output electrode of the load element of the first loading means, when the input switching element lies in cutoff state.

Yet further, according to the invention, as shown in FIG. 11, since the signal output terminal is supplied with a voltage by putting only either one of the one and the another switching element into conduction state according to the voltage level of the another output electrode of the input switching element, fed to the respective control electrodes via the control terminal, the one and the another power source terminal whose control electrodes are supplied with the power source voltages of the different voltage levels, are prevented from conducting to each other, so that current flow through the output switching element can be reduced.

Yet further, according to the invention, as shown in FIG. 12, the output switching element 911 comprises a first switching element, a second switching element and a bridge circuit, and the bridge circuit is supplied with voltages of the voltage levels of the respective another output electrodes of the first and the second switching element. The bridge circuit is composed of third and fourth switching elements of the same conduction type as that of the first switching element and fifth and sixth switching elements of the same conduction type as that of the second switching element. The one output electrode of each of the fifth and sixth switching elements is connected to the another power source terminal, the one output electrode of each of the third and fourth switching elements is connected to the one power source terminal. The another output electrode of each of the third and fifth switching elements and the control electrode of the fourth switching element are connected in common. The another output electrode of each of the fourth and sixth switching elements and the control electrode of the third switching element are connected in common to the signal output terminal. Since the level of a voltage outputted from the bridge circuit is determined by the voltage level of the another output electrode of the input switching element and the converted voltage level, conduction between the one and the another power source terminal which are supplied with power source voltages of different voltage levels is prevented, so that current flow through the output switching element can be reduced.

BRIEF DESCRIPTION OF THE DRAWINGS

Other and further objects, features, and advantages of the invention will be more explicit from the following detailed description taken with reference to the drawings wherein:

FIG. 9 is a block diagram showing a constitution of a gate driver 41a;

FIGS. 10A and 10B are diagrams showing relations of input and output in the gate driver 41a;

FIG. 37 is a block diagram showing a constitution of a conventional gate driver 11a;

FIG. 38 is a circuit diagram of a level shifter 17 contained in the gate driver 11a; and FIG. 39 is a diagram showing a relation of input and output in the gate driver 11a.

DETAILED DESCRIPTION OF THE PREFERRED EMBODIMENTS

Figure 1:
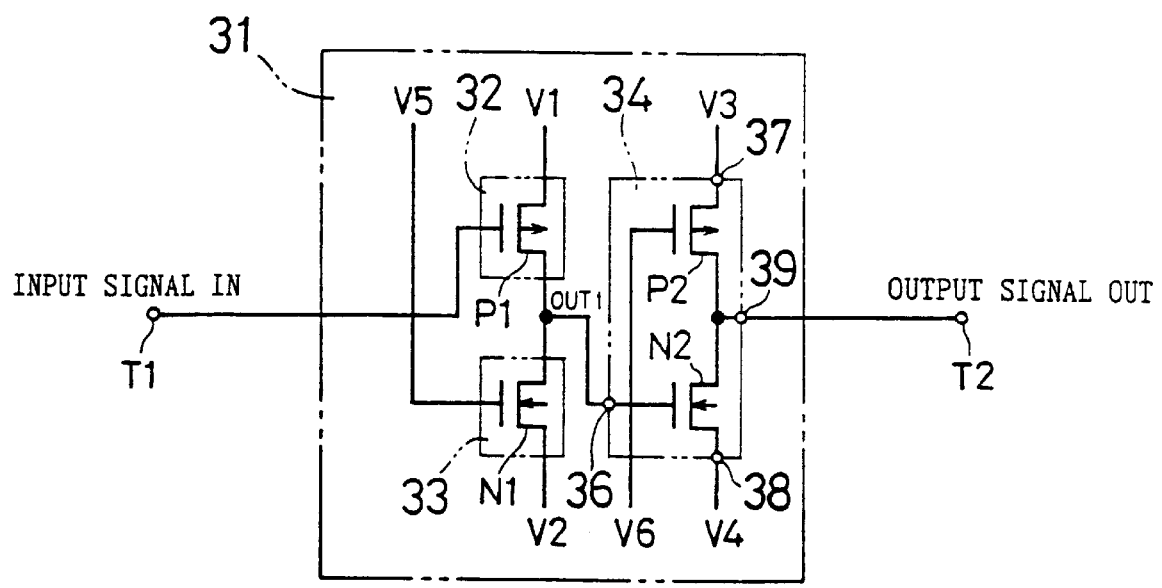
FIG. 1 is a circuit diagram showing a constitution of a level converting circuit 31 in a first embodiment of the invention.

Now referring to the drawings, preferred embodiments of the invention are described below.

FIG. 1 is a circuit diagram of a level converting circuit 31 of a first embodiment of the invention. This level converting circuit 31 converts an input signal IN having an amplitude of (0V–5V) referred to a GND voltage 0V as a first reference voltage level into an output having an amplitude of (VSS-VCC) referred to a voltage VSS (=V4) as a second reference voltage level. The level converting circuit 31 comprises a switching element 32, a load circuit 33, and an output circuit 34. The level converting circuit 31 is provided with a P-channel MOS transistor P1 as the switching element 32, and an N-channel MOS transistor N1 as the load circuit 33. The output circuit 34 includes an N-channel MOS transistor N2 as a switching element, and a P-channel MOS transistor P2 as output side loading element.

In the level converting circuit 31, an input signal inputted via an input terminal T1 is supplied to a gate which is a control electrode of the P-channel MOS transistor P1. A source which is one output electrode of the P-channel MOS transistor P1 is supplied with voltage V1 of a first voltage level. A drain of the transistor N1 is connected to a drain which is another output electrode of the P-channel MOS transistor.

A threshold voltage VP1 of the P-channel MOS transistor P1 and an amplitude of the input signal are set so that the threshold voltage may exist within the amplitude of the input signal, and when the input signal is of a low level, the transistor P1 conducts, and when being of a high level, the transistor P1 is cut off. The threshold voltage VP1 of the P-channel MOS transistor P1 has the following relation with respect to a voltage VIN of the input signal SP and the first voltage level V1.

$$\text{VIN}-\text{V1}<\text{VP1} \tag{1}$$

Voltage V5 is supplied to a gate of the N-channel MOS transistor N1 which serves as the load circuit 33, and the N-channel MOS transistor N1 is always in conduction state. Voltage V2 of the second voltage level is supplied to a source of the N-channel MOS transistor N1. The voltages of the respective drains of the transistors P1 and N1 are fed to a gate of the N-channel MOS transistor N2 as signal OUT 1 via a signal input terminal 36 described below. Voltage V1 and voltage V2 are set so that voltage V1 may be higher than voltage V2, and that a threshold voltage VN2 of the N-channel MOS transistor N2 exists between the two voltages V1, V2.

Therefore, when a fourth voltage level as described later is indicated by V4, the relation of voltage V1, voltage V2, and the threshold voltage VN2 of the N-channel MOS transistor N2 may be expressed as follows:

$$\text{V2}-\text{V4}<\text{VN2}<\text{V1} \tag{2}$$

In the output circuit 34, a source of the transistor P2 is supplied with voltage V3 of a third voltage level, and a source of the transistor N2 is supplied with voltage V4 of a fourth voltage level. A drain of the transistor P2 is connected to a drain of the transistor N2 wherein the voltage at the connection point 39 is outputted as an output signal OUT.

A gate of the transistor P2 is supplied with voltage V6, and the transistor P2 is always in conduction state. The resistance value of the transistor P2 is set so that it may be sufficiently larger than the on-resistance of the transistor N2, and the transistor P2 operates as a load transistor. The gate of the transistor N2 is supplied with the signal OUT 1 which is a voltage at the connection point 39 of the transistors P1 and N1, and conduction and cutoff of the transistor N2 is controlled depending on the signal level of the signal OUT1.

When the signal OUT1 becomes a high level signal, namely, voltage V1, the transistor N2 conducts and the output signal OUT becomes voltage V4. To the contrary, when the signal becomes a low level signal, namely, voltage V2, the transistor N2 is cut off and the output signal OUT becomes V3. Voltages V3 and V4 are defined so that voltage V3 is higher than voltage V4. Voltages V3 and V4, the amplitude of the signal outputted from the level converting circuit 31 is determined by voltages V3 and V4.

The relation of voltages V3 and V4 is expressed as follows:

$$V4 < V3 \quad (3)$$

The voltages of the respective drains of the MOS transistors N2 and P2 are fed to a below-mentioned shift register 42, to which both the drains of the MOS transistors N2 and P2 are connected in common. The signal OUT outputted from the input level converting circuit 31 via an output terminal T2 is set, for example, in this embodiment, so as to have an amplitude of 5 V, and therefore the shift register 42 may be designed to operate at a low voltage.

Since the gate of the N-channel MOS transistor N1 is supplied with voltage V5 which exceeds the threshold VN1 of the transistor N1, the transistor N1 is always in conduction state. Therefore, the relation between voltage V5 and the threshold voltage of the N-channel MOS transistor N1 is expressed as follows:

$$V5 - V2 \geq VN1 \quad (4)$$

The transistor N1 is designed so as to have a resistance value sufficiently higher than the ON-resistance of the P-channel MOS transistor P1, and is structured as a load transistor.

On the other hand, since the gate of the P-channel MOS transistor P2 is supplied with voltage V6 set less than the threshold VP2 of the transistor P2, and hence the transistor P2 is always in conduction state. Therefore, the relation of voltage V6 and the threshold voltage VP2 of the P-channel MOS transistor P2 is expressed as follows:

$$V6 - V3 \leq P2 \quad (5)$$

The transistor P2 is designed to have a resistance value sufficiently higher than the ON-resistance of the transistor N2, and is structured as a load transistor the same as in the transistor N1.

Voltages V1 to V6 may have individually different voltage values. As far as the formulas (1) to (5) determined as conditions for the voltages are satisfied, plural voltages may have one and the same voltage value. For instance, V1 and V2 may be identical to V3 and V4, respectively.

Suppose that a signal having an amplitude of 5 V is inputted to the input terminal T1 and that the signal is changed from 5 V to 0 V, the P-channel MOS transistor P1 conducts, and voltage V1 is supplied to the gate of the N-channel MOS transistor N2 of the next stage to put the transistor N2 into conduction state. By the conduction of the transistor N2, voltage V4 is outputted from the level converting circuit 31. When a signal of 5 V is inputted to the input terminal T1, since the P-channel MOS transistor P1 is cut off, voltage V2 is supplied to the transistor N2 of the next stage through the transistor N1 which is put into conduction state by the application of voltage V5 to the gate of the transistor N1. When voltage V2 is supplied to the transistor N2, the transistor N2 is cut off, and voltage V4 is not outputted. However, voltage V3 is outputted from the level converting circuit 31 by the transistor P2, which is put into conduction state by the application of voltage V6 to the gate thereof. Therefore, the signal outputted from the output terminal T2 of the level converting circuit 31 has an amplitude of between voltages V3 and V4.

Figure 2:
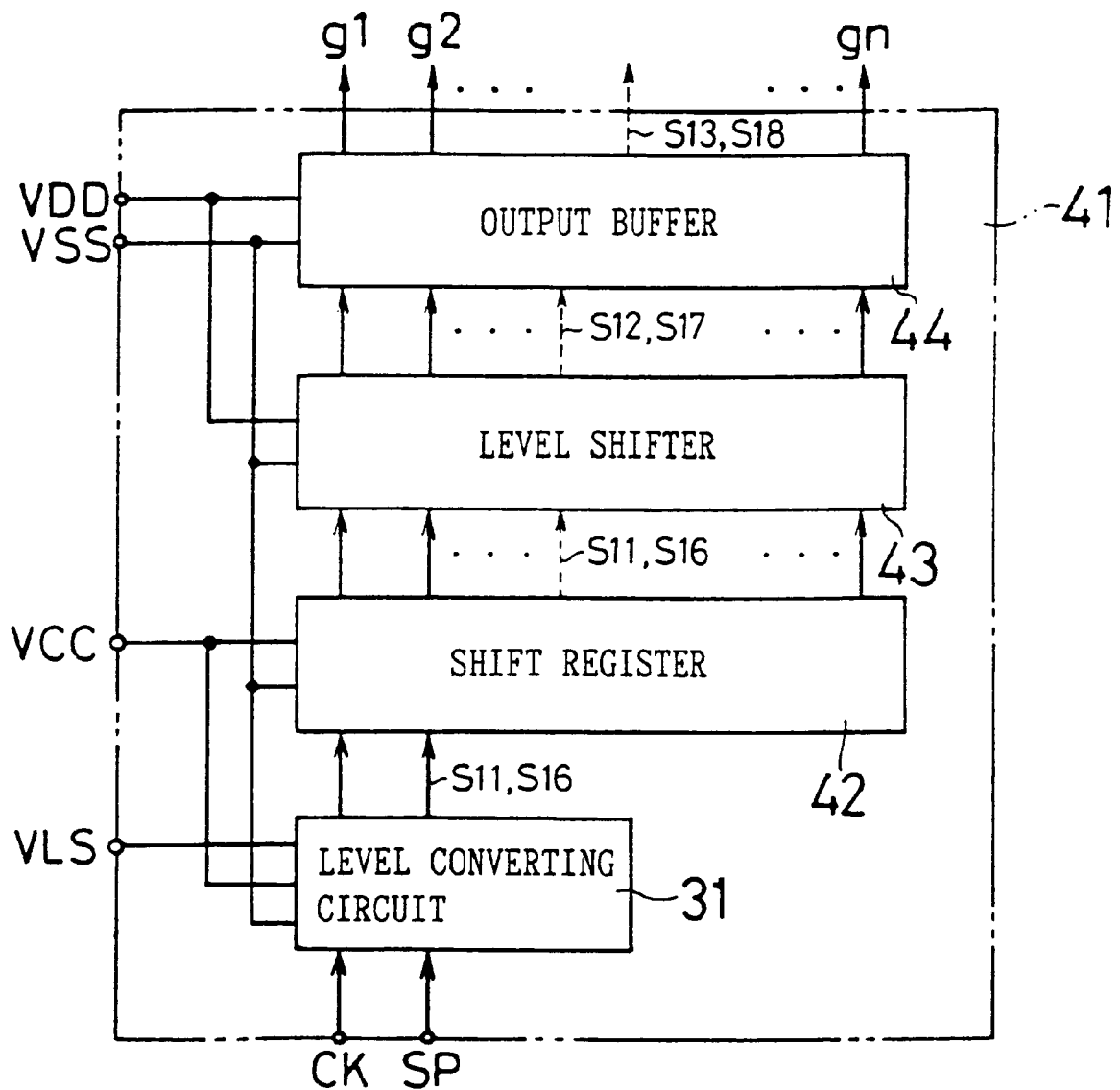
FIG. 2 is a block diagram showing a constitution of a gate driver 41.
Figure 3:
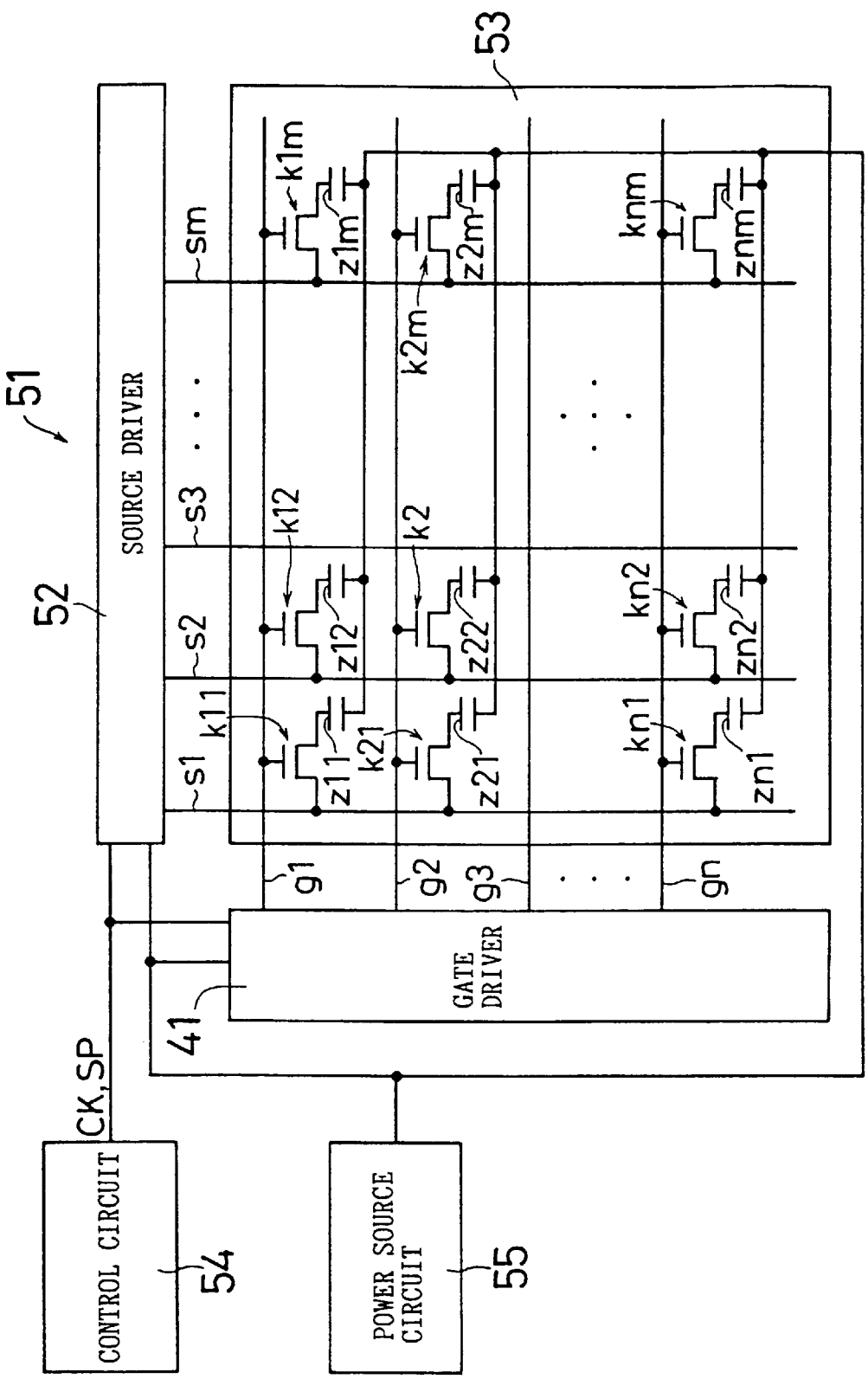
FIG. 3 is a block diagram showing a constitution of a display device 51.
Figure 4A:
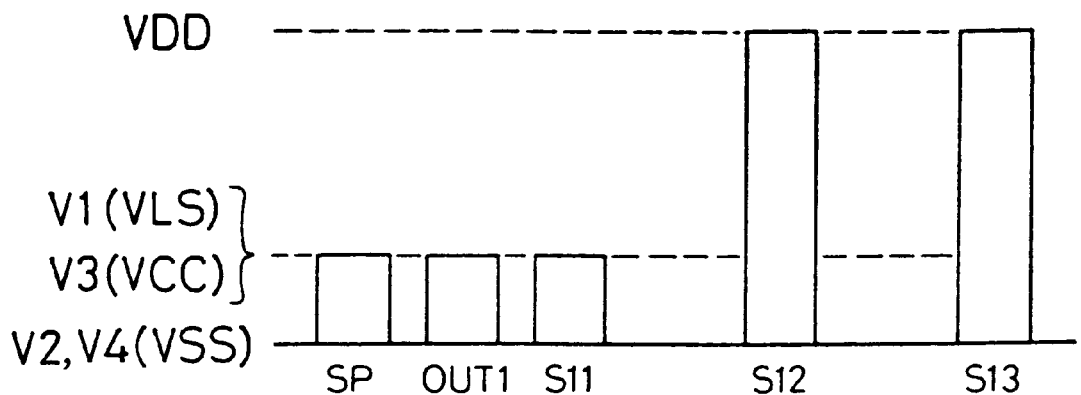
FIGS. 4A and 4B are diagrams showing relations of input and output in the gate driver 41.

FIG. 2 shows a constitution of a gate driver 41 comprising the level converting circuit 31, and FIG. 3 shows a constitution of a display device 51, and FIGS. 4A and 4 B are diagrams showing relations of input and output in the gate driver 41.

The display device 51 comprises a gate driver 41, a source driver 52, a liquid crystal display panel 53, a control circuit 54, and a power source circuit 55. The liquid crystal display panel 53 is a liquid crystal display panel of TFT (thin film transistor) type, and comprises mutually orthogonal source lines s1, s2, s3, . . . , sm (generically denoted by reference code s) and gate lines g1, g2, g3, . . . , gn (generically denoted by reference code g). Near the intersections of the source lines s and gate lines g, TFT k11, k1 2, . . . , knm (generically denoted by reference code k) are provided, and pixel electrodes z11, z 12, . . . , znm (generically denoted by reference code z) are provided in the drains of TFT k. Counter electrodes are provided across between the pixel electrodes z and liquid crystal layer.

The operations of the source driver 52 and gate driver 41 for applying signals to the source lines s and gate lines g are controlled according to the signal supplied from the control circuit 54. For example, at least clock signal CK and start pulse SP are inputted to the gate driver 41. Plural types of voltages are supplied to the drivers 41, 52 from the power source circuit 55.

As shown in FIG. 2, the gate driver 41 comprises the input level converting circuit 31, a shift register 42, a level shifter 43, and an output buffer 44. In the gate driver 41, the same constituent elements as in the gate driver 11 are not explained herein, and only different points including the input level converting circuit 31 will be explained. A clock signal CK and a start pulse SP are inputted into the input level converting circuit 31. The clock signal CK is then directly supplied to the shift register 42.

Figure 34:
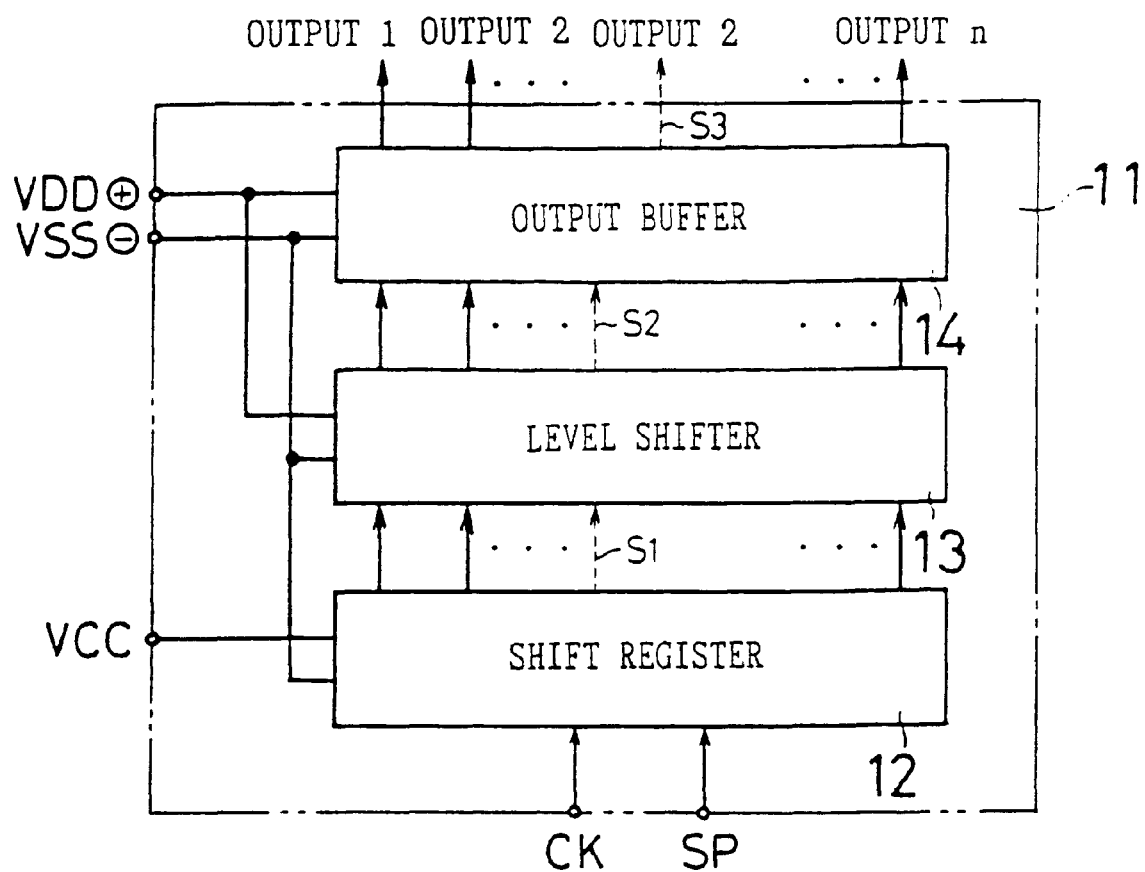
FIG. 34 is a block diagram showing a constitution of a conventional gate driver 11.
Figure 35:
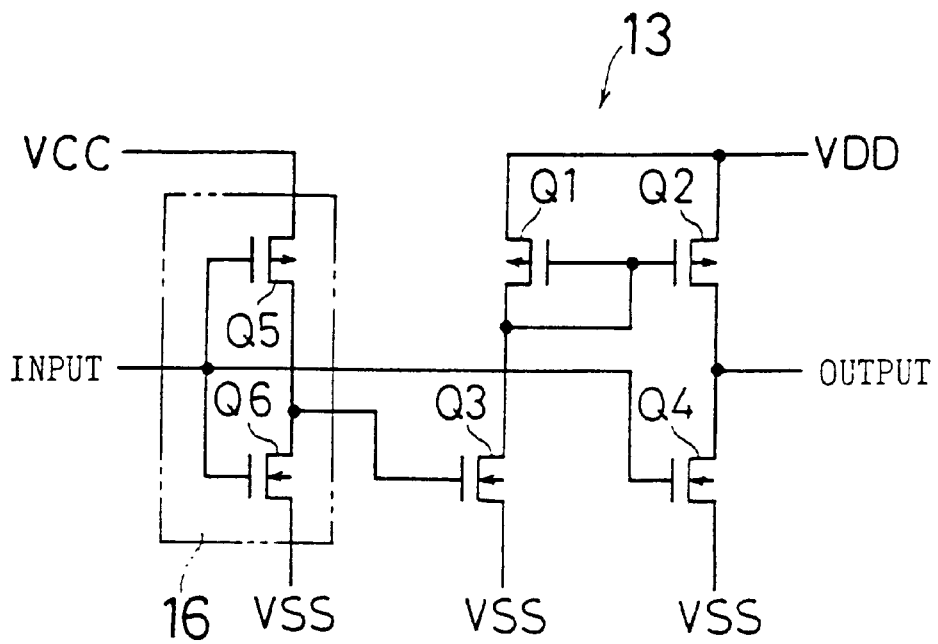
FIG. 35 is a circuit diagram of a level shifter 13 contained in the gate driver 11.
Figure 36:
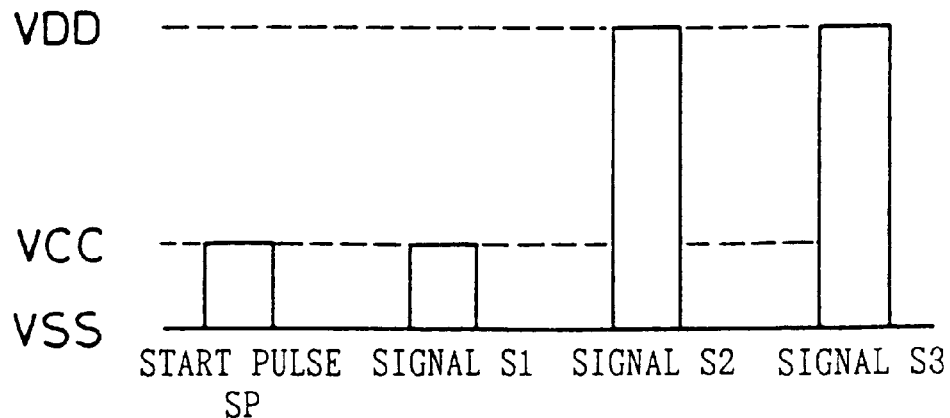
FIG. 36 is a diagram showing a relation of input and output in the gate driver 11.

Plural voltages are supplied to the gate driver 41 from the power source circuit 55. And this gate driver 41 has a such constitution that the level converting circuit 31 is added to the gate driver 11 shown in FIG. 34. The gate driver 41 is supplied with voltages VDD and VSS to the output buffer 44, voltages VDD and VSS to the level shifter 43, and voltages VSS and VCC to the shift register 42 in order to derive output signals S12, S13; S17, S18 having the second reference voltage level VSS.

In the case where the gate driver 41 is in a positive power source specification in which the signals S12, S13 having positive voltage, referring to FIG. 1, voltage VCC is supplied as voltage V3, and voltage VSS is supplied as voltage V4 to the input level converting circuit 31. Voltage VSS is supplied as voltages V2 and V6, voltage VLS is supplied as voltage V1, and voltage VCC is supplied as voltage V5 in the case of positive power source specification. When the gate driver 41 outputs a positive voltage, for instance, voltage VDD is 30 V, voltage VCC is 5 V, voltage VLS is 5 V, and voltage VSS is 0 V, which is the ground voltage.

In the case where the gate driver is in the positive power supply specification, the start pulse SP whose signal level is shown in FIG. 4A has a high level of voltage VLS and a low level voltage of voltage VSS, i.e. the first reference voltage level. The level of the input signal SP is converted by the level converting circuit 31 to become a signal S11 shown in FIG. 4A. The signal S11 has a high voltage of voltage VCC and a low voltage of voltage VSS. The signal OUT 1 has a high voltage of voltage VLS and a low voltage of voltage VSS, i.e. the second reference voltage level. The signal S11 is fed into the level shifter 43, and shifted in level, and becomes a signal S12 shown in FIG. 4A. The signal S12 has a high voltage of voltage VDD and a low voltage of voltage VSS. The signal S12 outputted from the level shifter 43 is outputted from the output buffer 44 into gate lines g1, g2, . . . , gn as a signal S13 shown in FIG. 4A, in a specified timing. The signal S13 has a high voltage of voltage VDD and a low voltage of voltage VSS. In this way, in the case where the gate driver 41 output the signal S13 of positive voltage, as the first reference voltage level VSS (low level of the input signal SP) supplied to the signal input terminal T1 and the second reference voltage level VSS (low level of the signal S11 ) required for the operation of the gate driver 41 are equal, the level converting circuit 31 outputs voltage VSS as the second reference voltage level.

Figure 4B:
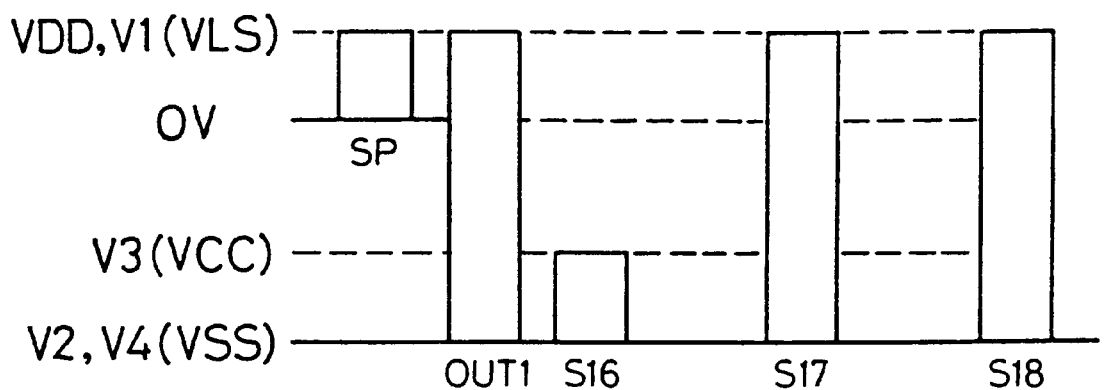

In the case where the gate driver 41 outputs the signal S 18 of negative voltage, however, referring to FIG. 4B, as the first reference voltage level 0 V (low level of the input signal SP) supplied to the signal input terminal and the second reference voltage level VSS (low level of the signal S16 ) required for the operation of the gate driver 41 differs from each other, it is necessary to convert the first reference voltage level 0 V to the second reference voltage level VSS.

Now, a configuration is described below that the gate driver 41 achieves a negative power supply specification where the gate driver 41 outputs output signals S17, S18 having negative second reference voltage level VSS. In the case where the gate driver 41 for outputting the signal S18 having the second reference voltage level VSS is in the negative power supply specification, that is, in the case where the gate driver 41 outputs the output signals S17, S18 having negative voltages, voltages VDD and VLS are 5 V, voltage VCC is –20 V, and voltage VSS is –25 V in FIG. 4B. When the gate driver 41 outputs a negative voltage, high level and low level voltages of the start pulse SP shown in FIG. 4B become voltages VLS=5 V and VCC=0 V or ground voltage, respectively. The start pulse SP is converted to a signal S16 shown in FIG. 4B by the level converting circuit 31. The signal S16 has a high voltage of voltage VCC (=–20 V) and a low voltage of voltage VSS (=–25 V). The signal OUT1 has a high voltage of voltage VLS and a low voltage of voltage VSS. In the case of negative power supply specification, voltage VLS is supplied as voltage V5. The signal S16 is fed into the level shifter 43, and shifted in level, and becomes a signal S17 shown in FIG. 4B. The signal S17 has a high voltage of voltage VDD and a low voltage of voltage VSS. The signal S17 outputted from level shifter 43 is outputted from the output buffer 44 into gate lines g1, g2, . . . , gn as a signal S18 shown in FIG. 4B, in a specified timing. The signal S18 has a high voltage of voltage VDD and a low voltage of voltage VSS.

Figure 5:
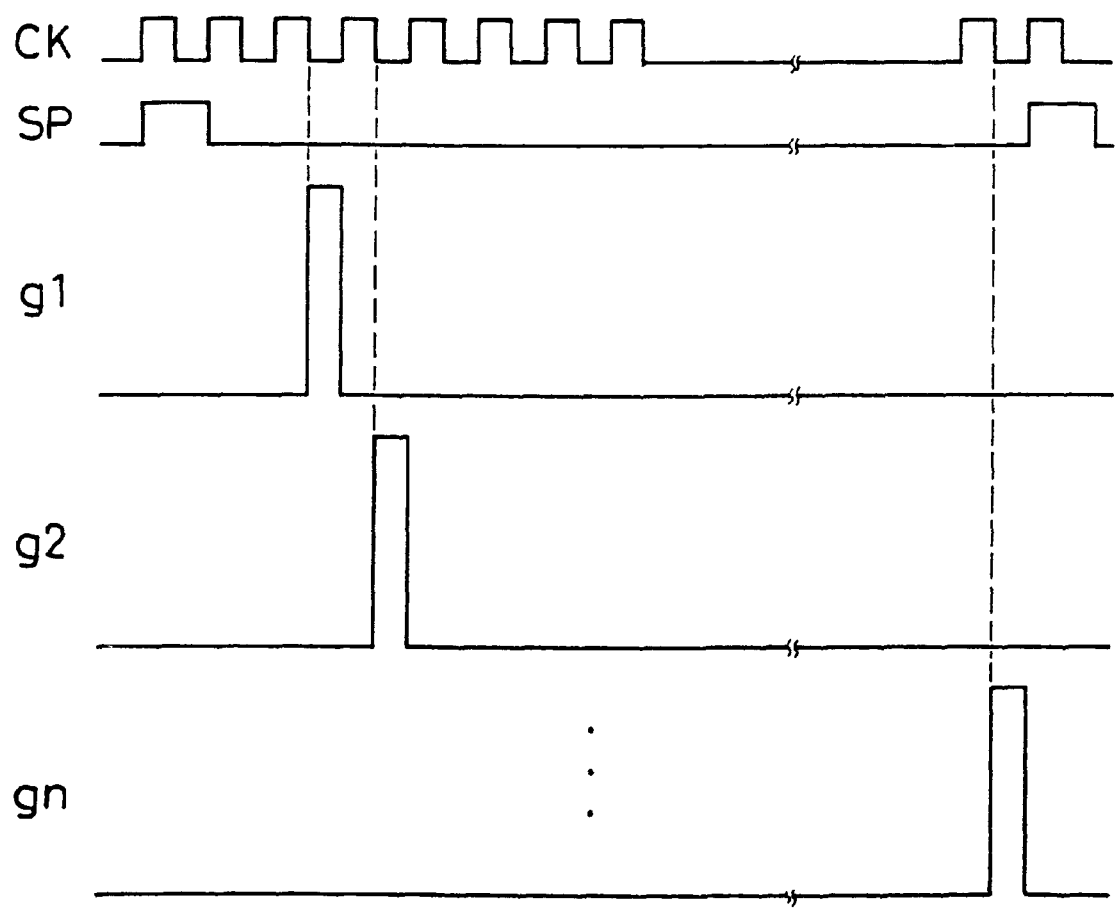
FIG. 5 is a timing chart of each signal in the gate driver 41.

FIG. 5 is a timing chart of each signal in the gate driver 41. In this timing chart, the signals S13 given to the respective gate lines g are indicated using the reference codes of the gate lines g. The clock signal CK is a signal to be fed in every predetermined period. Signals g1, g2, gn are outputted at the falling edge of clock signal CK. The start pulse SP rises at least every n times of clock signal CK falling.

Figure 6A:
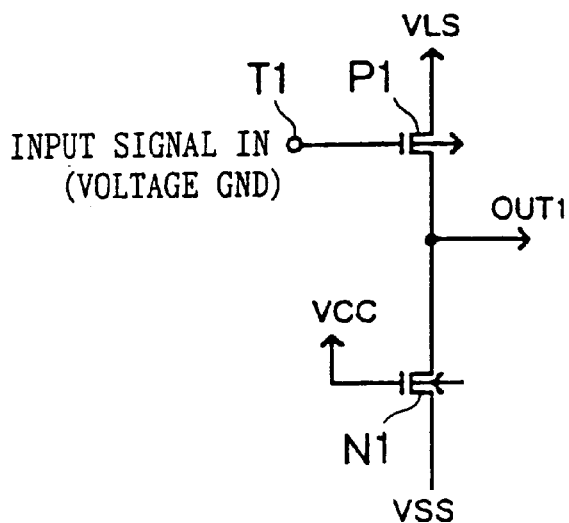
FIGS. 6A and 6 B are diagrams for explaining an operation of the level converting circuit 31 in the positive power source specification.
Figure 6B:
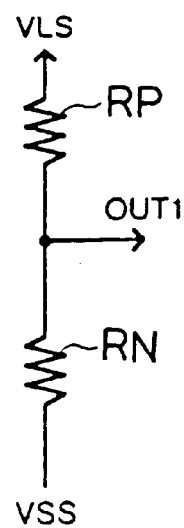

FIGS. 6A and 6B are diagrams for illustrating the operation of the level converting circuit 31 in positive power source specification. FIG. 6A shows the constitution of the input stage of the level converting circuit 31 and FIG. 6B shows an equivalent circuit of the input stage.

When the level converting circuit 31 is set to be in the positive power source specification, that is, voltages VLS and voltage VCC are equivalent, the transistors N1 and P1 constituting the input stage will operate in a resistance operation range. When the input signal IN is of a low level, a gate of the transistor P1 is supplied with the ground voltage GND, and the transistor P1 becomes a resistance RP equivalently. Furthermore, since by setting voltage VLS and voltage VCC equivalent, the signal level of the signal OUT1 can not rise higher than voltage VCC supplied to the gate, the transistor N1 becomes a resistance RN equivalently.

In the case where the input signal IN is of a low level, the level of the signal OUT1 is preferably voltage VLS, but practically the level which is derived by dividing voltage VLS on the basis of the resistances RP and RN. In such a case, the relation of RP<<RN is satisfied.

Figure 7:
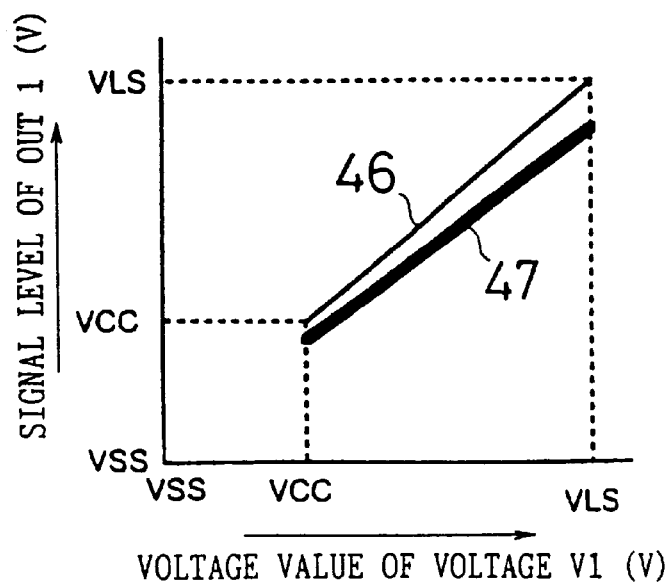
FIG. 7 shows graphs showing relations between voltage values of voltage VLS and signal levels of a signal OUT1 in the level converting circuit 31.

FIG. 7 shows relations of voltage values of voltage V1 and signal levels of the signal OUT 1 in the level converting circuit 31 in the case where voltage V5 is set to voltage VCC. The axis of abscissa indicates voltage values (V) of voltage V1 and the axis of ordinate indicates signal levels (V) of the signal OUT 1. When a characteristic line 46 indicating the voltage values of voltage V5 supplied to the gate of the transistor N1 rises from voltage VCC to voltage VLS, a characteristic line 46 also rises in the same manner. The relation of voltage values of voltage V1 and signal levels of the signal OUT1 is determined on the basis of the resistance values of the equivalent resistances RP and RN. Thus, according to the embodiments of FIGS. 1 through 7, by providing the level converting circuits 31 in the gate driver 41 which uses the second reference voltage level VSS, the gate driver 41 is enabled to operate even when the first reference voltage level 0 V of the input signal SP supplied to the signal input terminal T1 (low level of the input signal SP) and the second reference voltage level VSS required for the circuits 42 to 44 within the gate driver to operate, are different from each other, as well as the two reference voltages are equal to each other. Accordingly, the gate driver 41 which uses voltage VSS as the second reference voltage can output the signals S13, S18 with either of positive or negative voltages by setting the first to sixth voltage levels individually.

Each transistor of the embodiment shown in FIGS. 1 thorough 7 can be replaced by the conductive type transistors which are complementary from each other. For another embodiment, a level converting circuit 31a of FIG. 8 has a constitution in which the polarity of the MOS transistors P1, P2, N1, N2 in the level converting circuit 31 is inverted, whereby the same effects as in the level converting circuit 31 can be obtained. In the constitution in which the N-channel MOS transistors N1, N2 are respectively replaced by the P-channel MOS transistors P1, P2 in this sequence, voltages V1 to V6 are determined to satisfy the following formulas (6) to (10). The level converting circuit 31a converts the input signal SP having amplitude of (0V–5V) referred to voltage VSS of 5 V into the output having amplitude of (VDD–VCC) referred to VDD (=V4 ).

$$IN - V1 > VN1 \tag{6}$$

$$V1 - V4 < VP2 < V2 - V4 \tag{7}$$

$$V3 < V4 \tag{8}$$

$$V5 - V2 \leq VP1 \tag{9}$$

$$V6 - V3 \geq VN2 \tag{10}$$

wherein VN1, VP2, VP1 and VN2 are the threshold voltages of the transistors N1, P2, P1 and N2, respectively.

Figure 8:
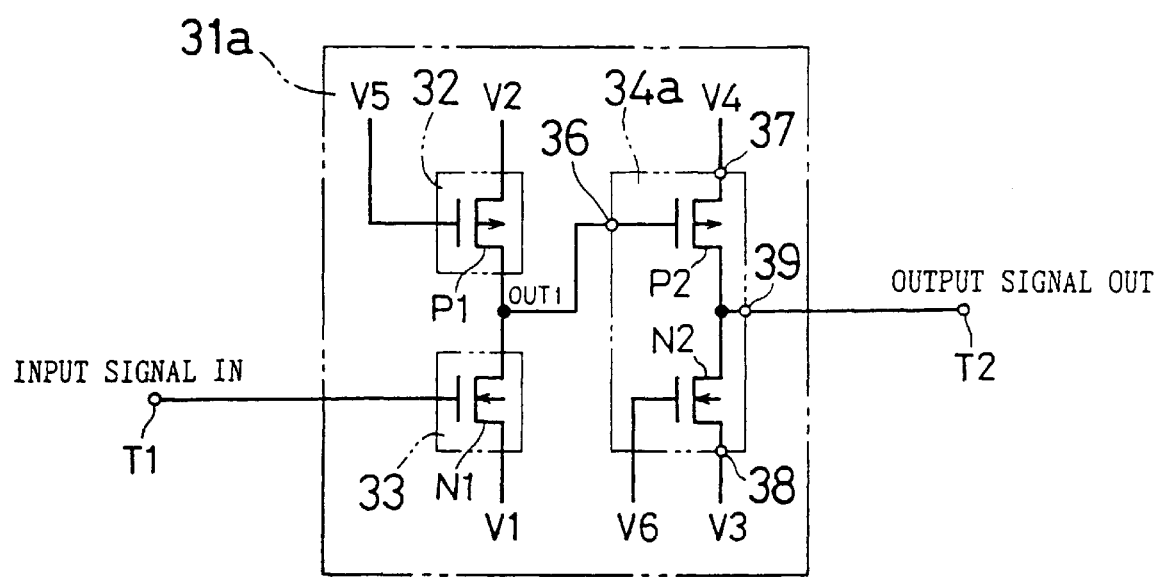
FIG. 8 is a circuit diagram showing a constitution of a level converting circuit 31a of another embodiment.
Figure 9:
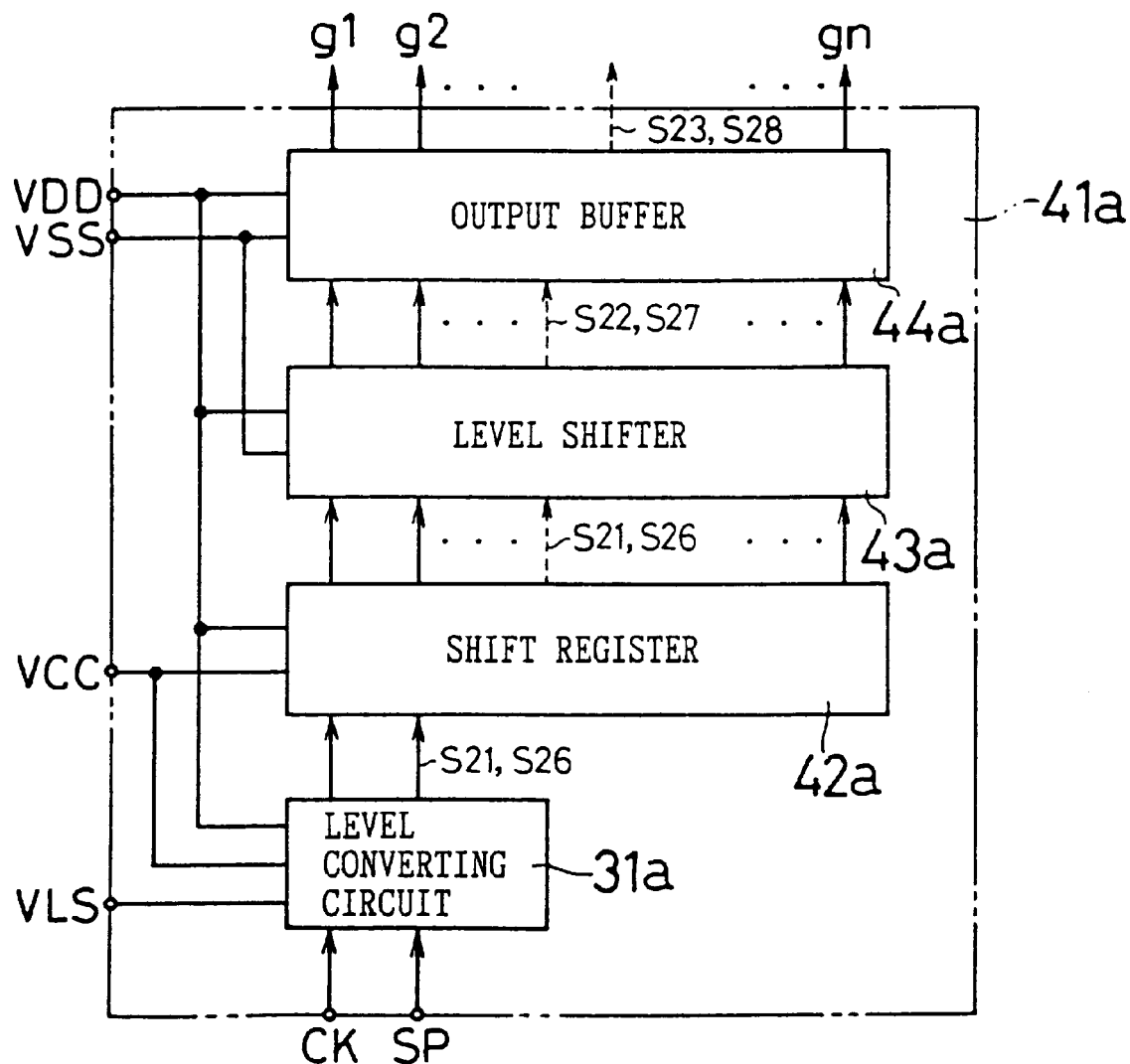
Figure 10A:
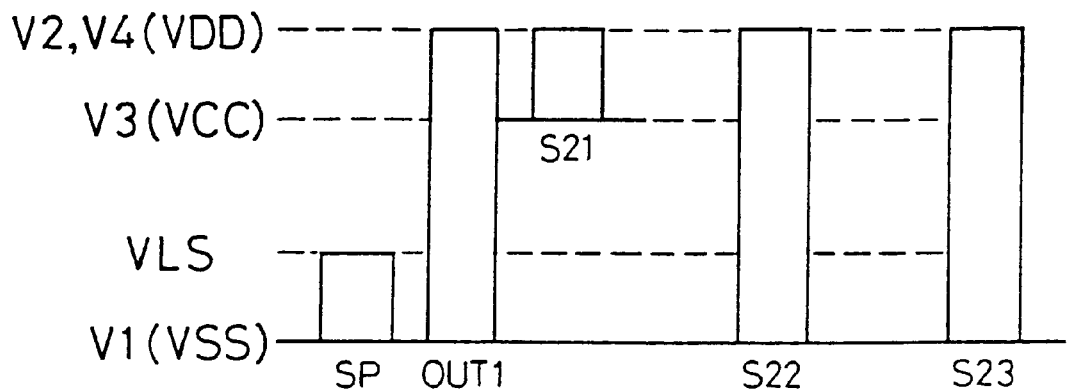
Figure 10B:
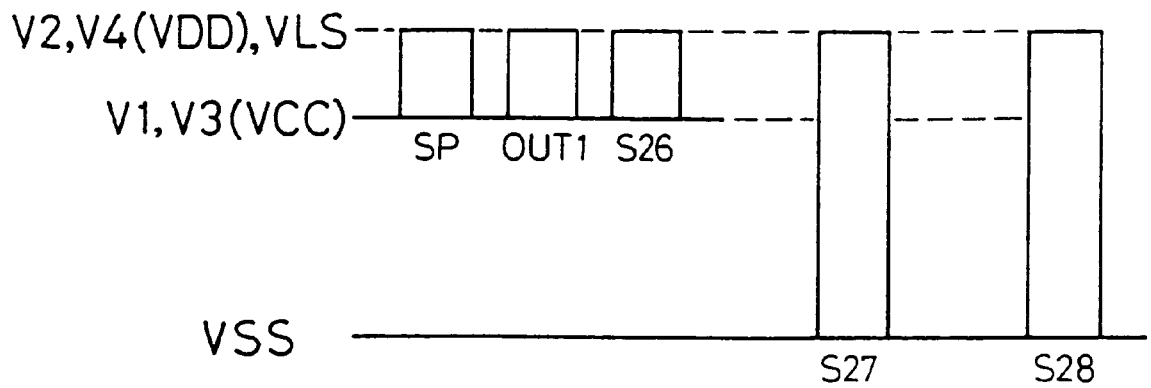
Figure 37:
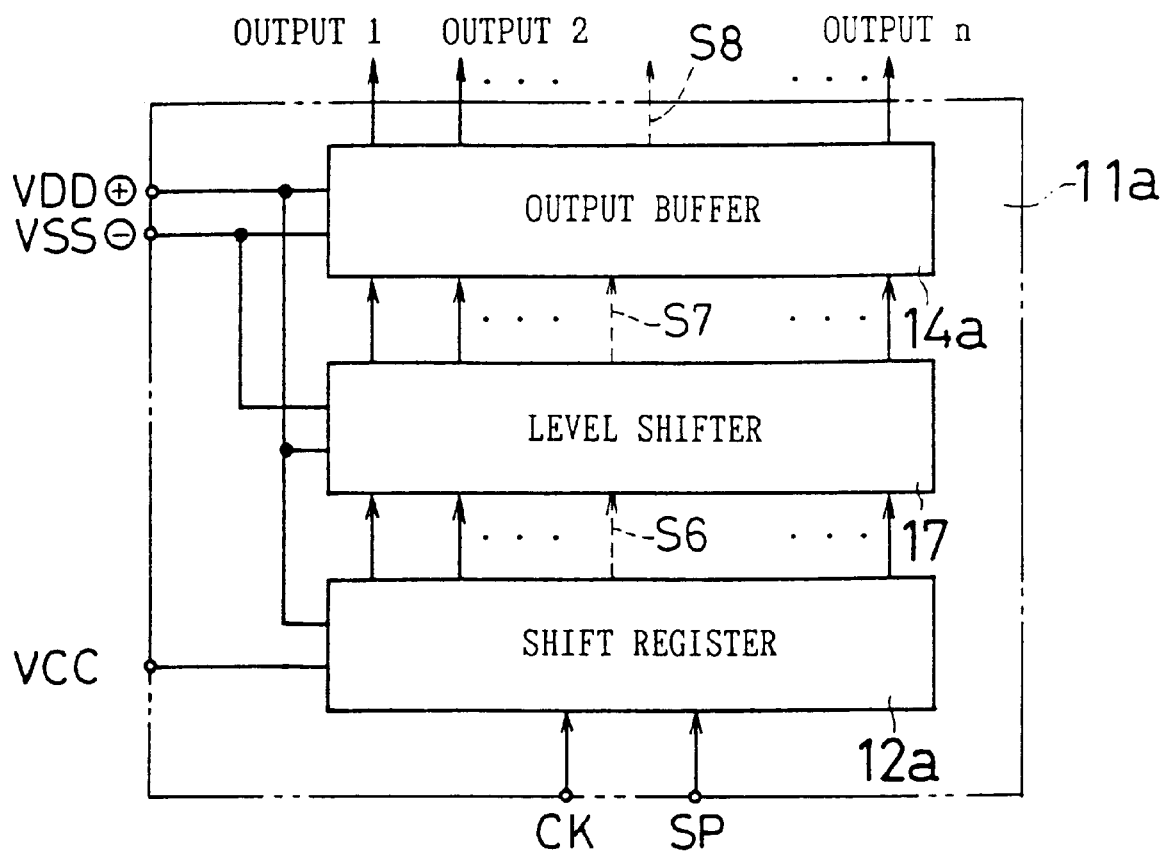
Figure 38:
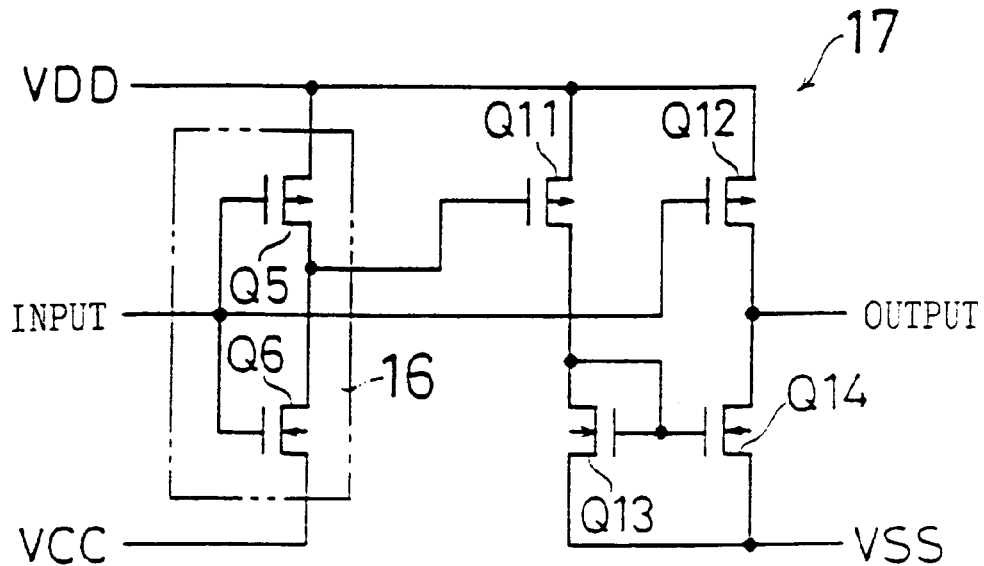
Figure 39:
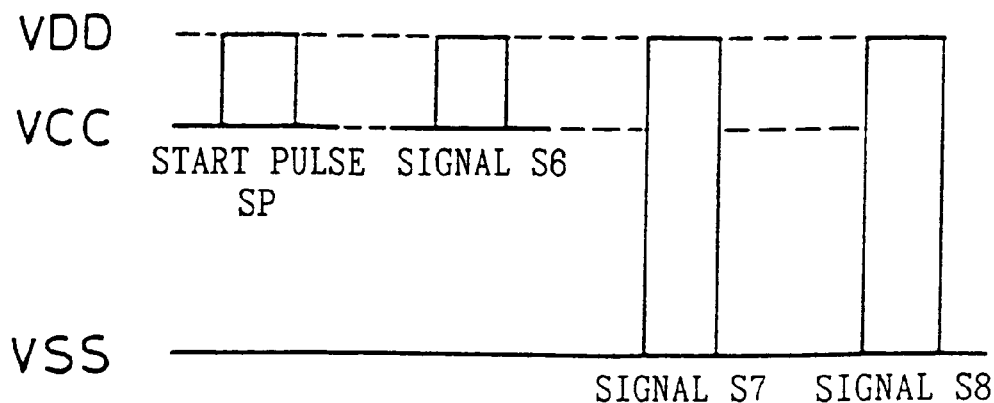

FIG. 9 shows a constitution of a gate driver 41a including the level converting circuit 31a used in FIG. 8, and FIGS. 10A and 10B show relations of input and output in the gate driver 41a. As compared to the gate driver 41 which was a gate driver whose reference voltage was a predetermined negative voltage (VSS), the gate driver 41a is a gate driver whose reference voltage is a predetermined positive voltage (=V4 ). The gate driver 41a has a constitution in which the level converting circuit 31a of FIG. 8 is added to the gate driver 11a of FIG. 37. The constitution of the gate driver 41a is similar to that of the gate driver 41, and the corresponding parts are distinguished by the same numerals used for the gate driver 41 except that "a" are added.

In the gate driver 41a, voltages VDD and VSS are supplied to the output buffer 44a, voltages VDD and VSS are supplied to the level shifter 43a, voltages VDD and VCC are supplied to the shift register 42a.

With referring to FIGS. 8 and 9, voltage VCC is supplied as voltage V3, and voltage VDD is supplied as voltages V4 and V6 to the input level converting circuit 31a. Further, as voltages V1 and V5, the GND voltage 0 V is supplied, as voltage V5, voltage VSS or ground voltage GND (=VCC) is supplied and as voltage V2, voltage VDD is supplied. In the case of the positive power source specification of FIG. 10A that the gate driver 41 a outputs a positive voltage, voltage VDD is 30 V, voltages VSS is 0 V or the ground voltage. Voltage VCC is 25 V, and voltage VLS is 5 V.

The start pulse SP whose signal level is shown in FIG. 10A has a high voltage of voltage VLS and a low voltage of voltage VSS. The start pulse SP is converted by the level converting circuit 31a to become a signal S21 shown in FIG. 10A. The signal S21 has a high level voltage of voltage VDD and a low level voltage of voltage VCC. The signal S21 is fed into the level shifter 43a, and shifted in level, and becomes a signal S22 shown in FIG. 10A. The signal S22 has a high level voltage of voltage VDD and a low level voltage of voltage VSS. The signal S22 outputted from the level shifter 43a is outputted from the output buffer 44a into gate lines g1, g2, . . . , gn as a signal S23 shown in FIG. 10A, in a specified timing. The signal S23 has a high level voltage of voltage VDD and a low level voltage of voltage VSS.

The operation of the gate driver 41a in the case of the positive power source specification of FIG. 10A where the gate driver 41a outputs a positive output voltage, is shown in the following. In the case where the gate driver 41a outputs the signals S22, S23 having positive output voltages, the level converting circuit 31a needs to convert the input signal SP having the first reference voltage level VLS of 5 V and an amplitude between the first reference voltage level VLS and 0 V, to the signal S21 having the second reference voltage level VDD of 30 V and an amplitude between the second reference voltage level VDD and voltage VCC of 25 V. Voltage VSS or the GND voltage 0 V is supplied to the gate of the N-channel MOS transistor P1 of the level converting circuit 31a, and the transistor P1 is in conduction state.

When a signal having an amplitude 5 V is fed to the input terminal T1 and the signal is changed from 0 V to 5 V, the N-channel MOS transistor N1 conducts, and thereby conduction of the transistor P2 of the next stage is caused. Consequently, a voltage of about 30 V, whose level is dropped from voltage V4=VDD by the level of the threshold voltage of the transistor P2, is outputted from the output terminal T2 of the level converting circuit 31a.

When a voltage of 0 V is supplied to the input terminal T1, the N-channel MOS transistor N1 is cut off, and voltage V2 outputted from the transistor P1 is supplied to the transistor P2 to cut off the transistor P2. Since voltage V6=VDD is supplied to the gate of the transistor N2, the transistor N2 is always in conduction state. Therefore, from the level converting circuit 31a is outputted voltage VCC. The level converting circuit 31a selectively outputs the output signals having voltage VSS (=30 V) and VCC (=25 V) depending on the signal level of the input signal IN from the output terminal T2.

When the gate driver 41a is in a negative power source specification and outputs a negative voltage, voltages VDD, VLS are 5 V, voltage VCC is 0 V, and voltage VSS is −25 V. The start pulse SP whose signal level is shown in FIG. 10B has a high voltage of voltage VLS and a low voltage of 0 V. The start pulse SP is converted by the level converting circuit 31a to become a signal S26 shown in FIG. 10B. The signal S26 has a high voltage of voltage VDD and a low voltage of voltage VCC.

The signal S26 is fed into the level shifter 43a, and shifted in level, and becomes a signal S27 shown in FIG. 10B. The signal S27 has a high voltage of voltage VDD and a low voltage of voltage VSS. The signal S27 outputted from the level shifter 43a is outputted from the output buffer 44a into gate lines g1, g2, . . . , gn as a signal S28 shown in FIG. 10B, in a specified timing. The signal S28 has a high voltage of voltage VDD and a low voltage of voltage VSS.

In the case of the negative power source specification shown in FIG. 10B, following relations are satisfied: V1=V3=V5=VCC=0 V, V2=V4=V6=VDD=VLS=5 V. VDD=5 V, VSS=−25 V, for example.

Although the transistor P1 is provided as an input loading element in the constitutions of the above embodiments, such a constitution may be employed that a plurality of transistors are arranged in series.

Figure 11:
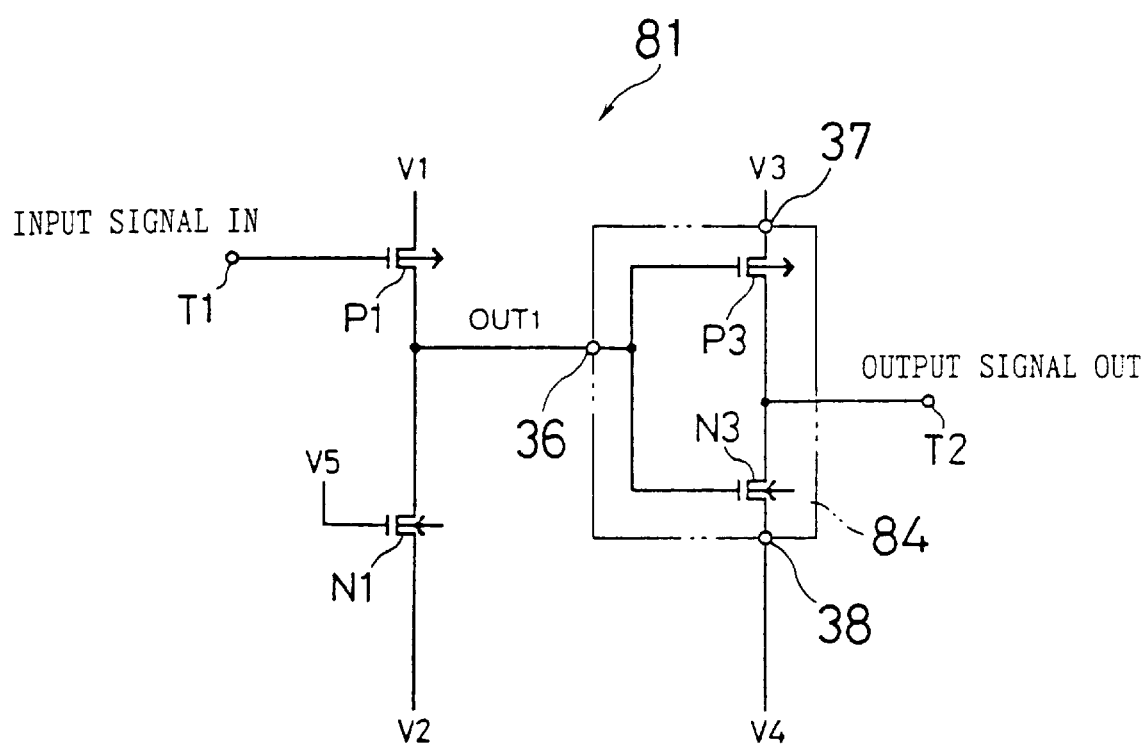
FIG. 11 is a circuit diagram of a level converting circuit 81 of still another embodiment.

FIG. 11 is a diagram for showing a level converting circuit 81 of still another embodiment of the invention. In the level converting circuit 81, elements identical to those in the level converting circuit 31 are given like reference characters and are not explained. The level converting circuit 81 comprises the P-channel MOS transistor P1, the N-channel MOS transistor N1 and an output circuit 84. The level converting circuit 81 is characterized in that the output circuit 84 is provided in lieu of the output circuit 34.

The output circuit 84 includes a P-channel MOS transistor P3 and a N-channel MOS transistor N3. The transistor P3 has a source which is supplied with voltage V3, and a drain which is connected to a drain of the transistor N3. A source of the transistor is provided with a voltage V4. A gate of each of the transistors N3 and P3 is supplied with the signal OUT1, depending on the signal level of which of either transistor N3 or P3 conducts. The voltage of the drains of the transistors N3 and P3 is outputted as the output signal OUT.

When the signal OUT1 becomes a voltage of a high level, namely voltage V1, the transistor N3 conducts, and the transistor P3 is cut off. Accordingly the level of the output signal OUT becomes that of voltage V4. When the signal OUT1 becomes a voltage of a low level, namely voltage V2, the transistor P3 conducts, and the transistor N3 is cut off. Accordingly the level of the output signal OUT becomes that of voltage V3. The signal level of the output signal OUT becomes a voltage on the side where the signal level of the input signal IN is converted with respect to the ground voltage GND used as a reference.

In the output circuit 84, either the transistor P3 or N3 conducts depending on the signal level of the signal OUT1, and the other is cut of f. Thereby the signal level of the output signal OUT is determined, and accordingly the transistors P3 and N3 do not conduct at the same time, and a through current between voltages V3 and V4 can be reduced, resulting in reduction of the consumption power in the level converting circuit 81.

Figure 12:
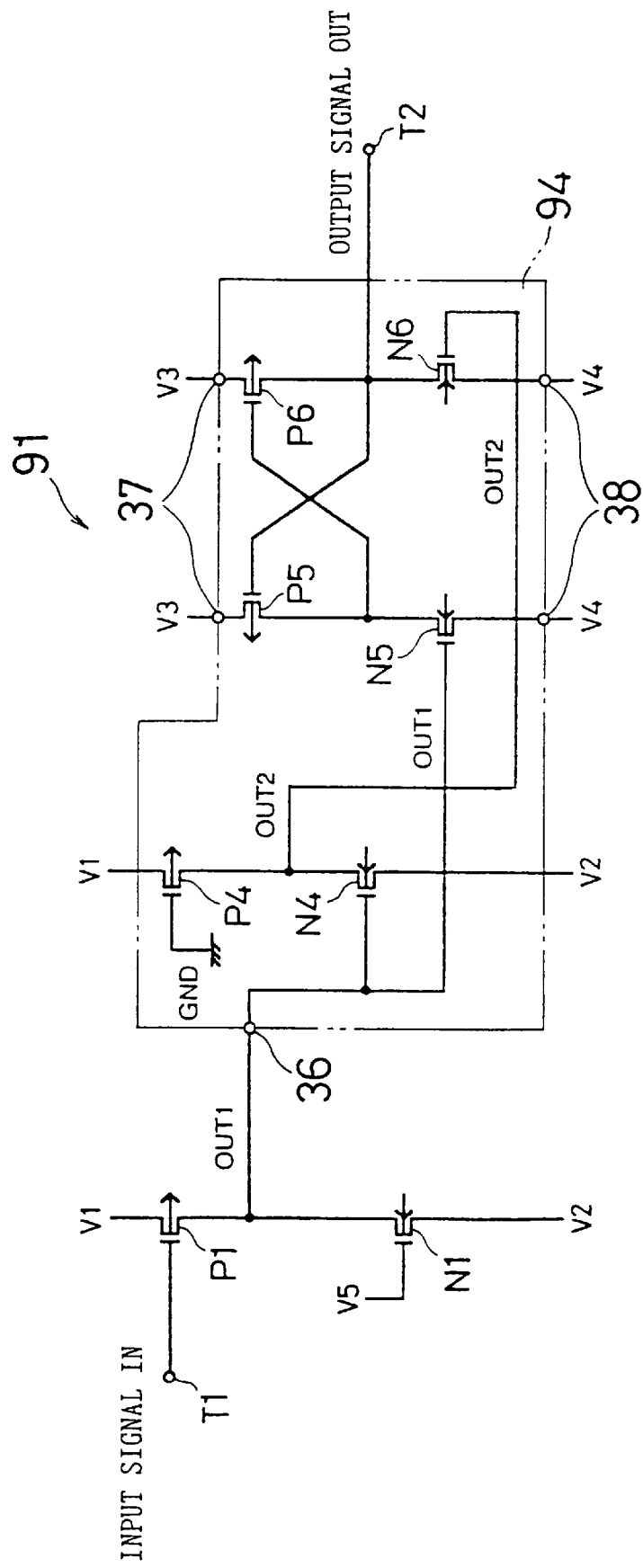
FIG. 12 is a circuit diagram of a level converting circuit 91 of yet another embodiment.

FIG. 12 is a diagram f or showing a level converting circuit 91 of yet another embodiment of the invention. In the level converting circuit 91, elements identical to those in the level converting circuit 31 are given like reference characters and are not explained. The level converting circuit 91 comprises the P-channel MOS transistor P1, the N-channel MOS transistor N1 and an output circuit 94. The level converting circuit 91 is characterized in that the output circuit 84 is provided in lieu of the output circuit 34.

The output circuit 94 includes P-channel MOS transistors P4, P5 and P6 and N-channel MOS transistors N4, N5 and N6. The transistor P4 has a source which is supplied with voltage V1, and a drain which is connected to a drain of the transistor N4. A gate of the transistor P4 is supplied with the ground voltage GND, and the transistor P4 continuously lies in conduction state. The transistor N4 has a source which is supplied with voltage V2 and a gate which is supplied with the signal OUT1. The voltage at the connection point of the transistors N4 and P4 is supplied as a signal OUT2 to a gate of the transistor N6. The signals OUT1 and OUT2 have mutually converted signal levels.

Each of the transistors P5 and P6 has a source which is supplied with voltage V3. The transistor P5 has a drain which is connected to a drain of the transistors N5, and the transistor P6 has a drain which is connected to a drain of the transistor N6. Gates of the transistors P5 and P6 are connected to the drains of the transistors N6 and N5, respectively. Accordingly the drain of the transistor P5 and the gate of the transistor P6 are connected to the drain of the transistor N5, and the drain of the transistor P6 and the gate of the transistor P5 are connected to the drain of the transistor N6. The voltage at the connection point of the transistors P6 and N6 is outputted as an output signal OUT. The sources of the transistors N5 and N6 are supplied with voltage V4.

When the signal OUT1 is of a high level, the transistor N5 conducts and the transistor N6 is cut off. When the transistor N5 is put into conduction state, the gate of the transistor P6 is supplied with voltage V4, and the transistor P6 conducts. At that time, since the transistor N6 is cut off, voltage V3 is outputted as the output signal OUT. When the signal OUT1 is of a low level, the transistor N6 conducts and the transistor N5 is cut off. When the transistor N6 is put into conduction state, the gate of the transistor P5 is supplied with voltage V4, and the transistor P5 conducts. At that time, since the transistor N5 is cut off, voltage V3 is supplied to the gate of the transistor P6, and the transistor P6 is cut off. Accordingly voltage V4 is outputted as the output signal OUT.

Figure 13A:
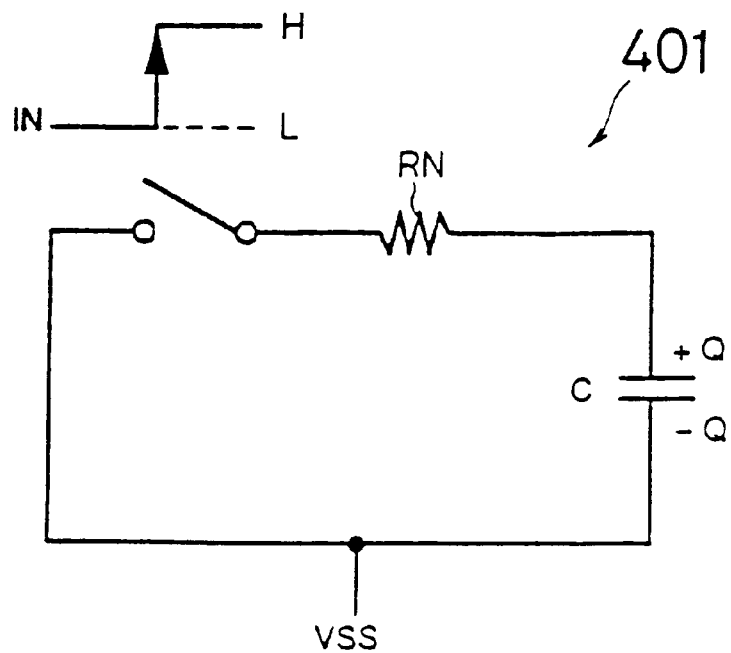
FIGS. 13A and 13B are equivalent circuit diagrams of the level converting circuit 81, 91 in the case of positive power source specification and negative power source specification, respectively.
Figure 13B:
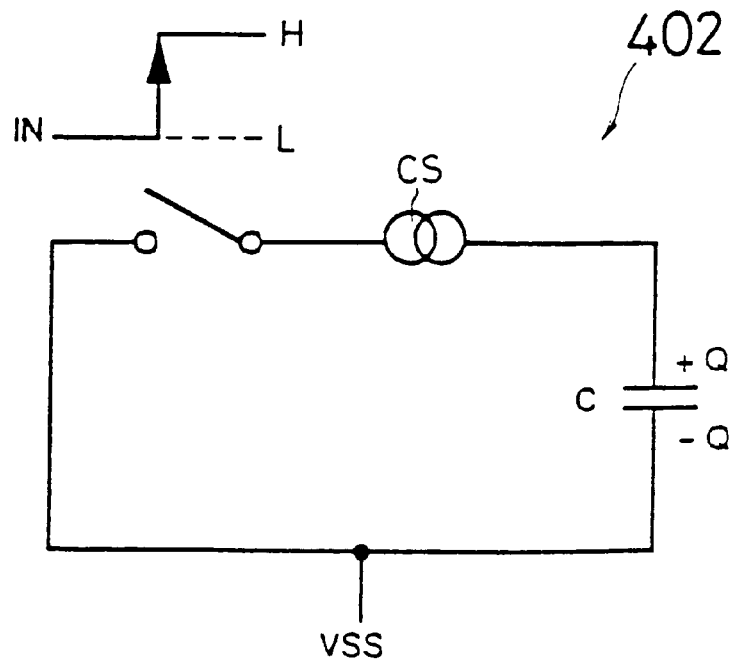

FIGS. 13A and 13B are equivalent circuit diagrams, referred to voltage VSS, of the level converting circuits 31, 81, 91 of FIGS. 1, 11 and 12 in the case of positive power source specifications and negative power source specifications, respectively. FIG. 13A shows an equivalent circuit 401 when the level converting circuit 31 is used in the positive power source specification. The transistor N1 is indicated equivalently as a resistance RN. FIG. 13B shows an equivalent circuit 402 when the level converting circuit 31 is used in a negative power source specification. In the negative power source specification the transistor N1 operates in a saturation region, and to view equivalently, is indicated as a constant power source CS. The liquid display panel 53 is equivalently indicated as a condenser C.

For a period the input signal IN is of a low level (L), the condenser C is charged with electric charge, and when the input signal becomes a voltage of a high level (H), discharge of the charged electric charge is started. In the equivalent circuit 401, electric charge is discharged via the resistance RN connected in series to the condenser C. In the equivalent circuit 402, when the input signal becomes a voltage of a high level, electric charge is discharged via the constant power source CS connected in series to the condenser C. In the case where electric charge is discharged via the constant power source CS, the time required for the discharge via the constant power source CS is longer than that via the resistance RN.

Additionally, depending on the specification of the power source range, the power source voltage is increased, for example, from 30 V to 42 V, and electric charge which the condenser is charged with is increased, resulting in that a further longer time is required for discharge.

Figure 14:
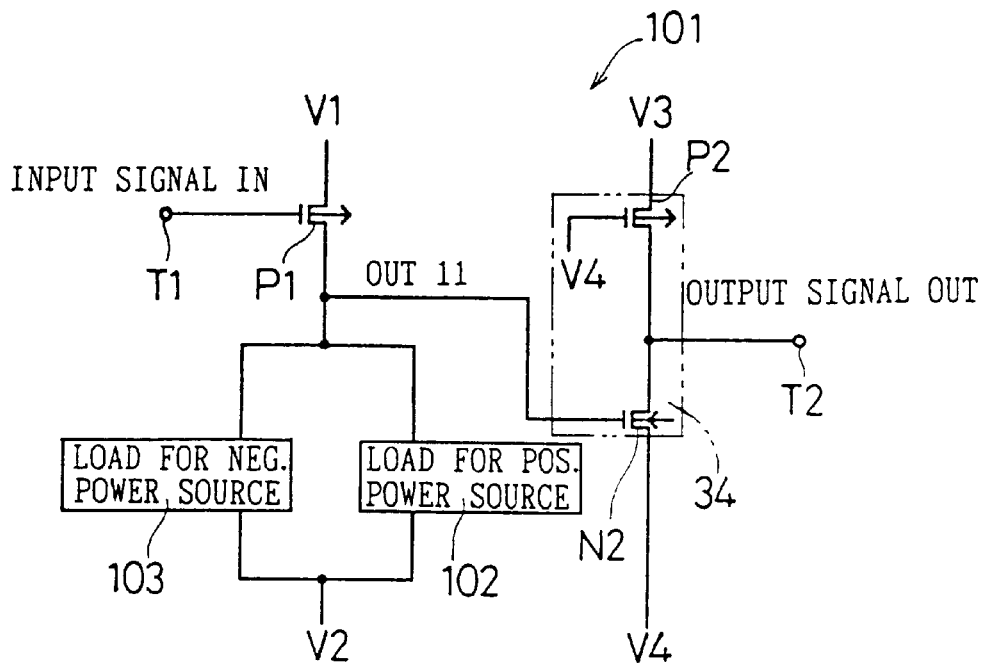
FIG. 14 is a circuit diagram of a level converting circuit 101.
Figure 15:
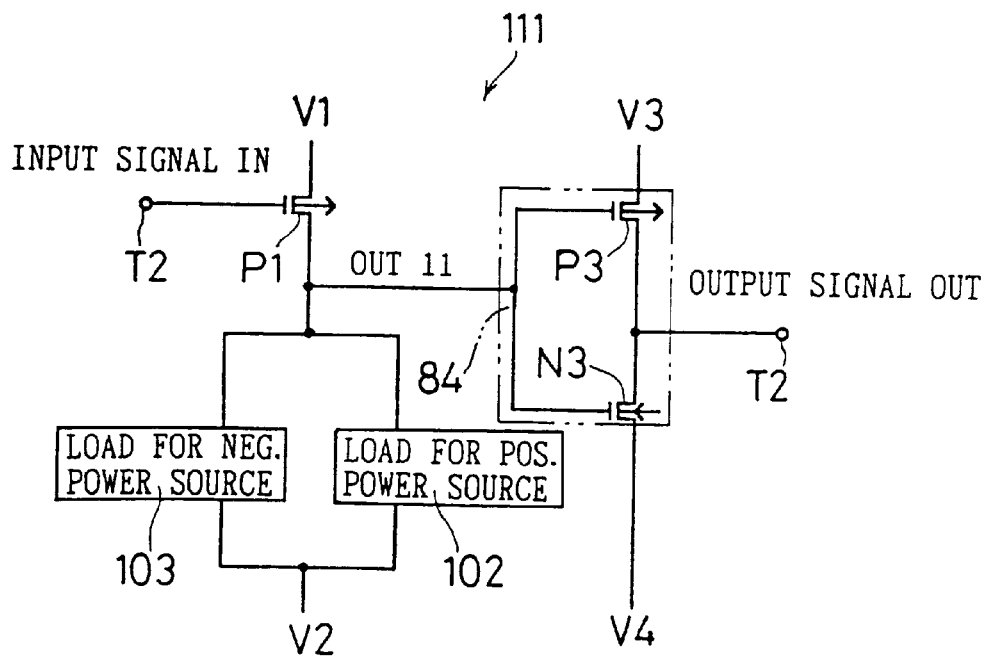
FIG. 15 is a circuit diagram of a level converting circuit 111.
Figure 16:
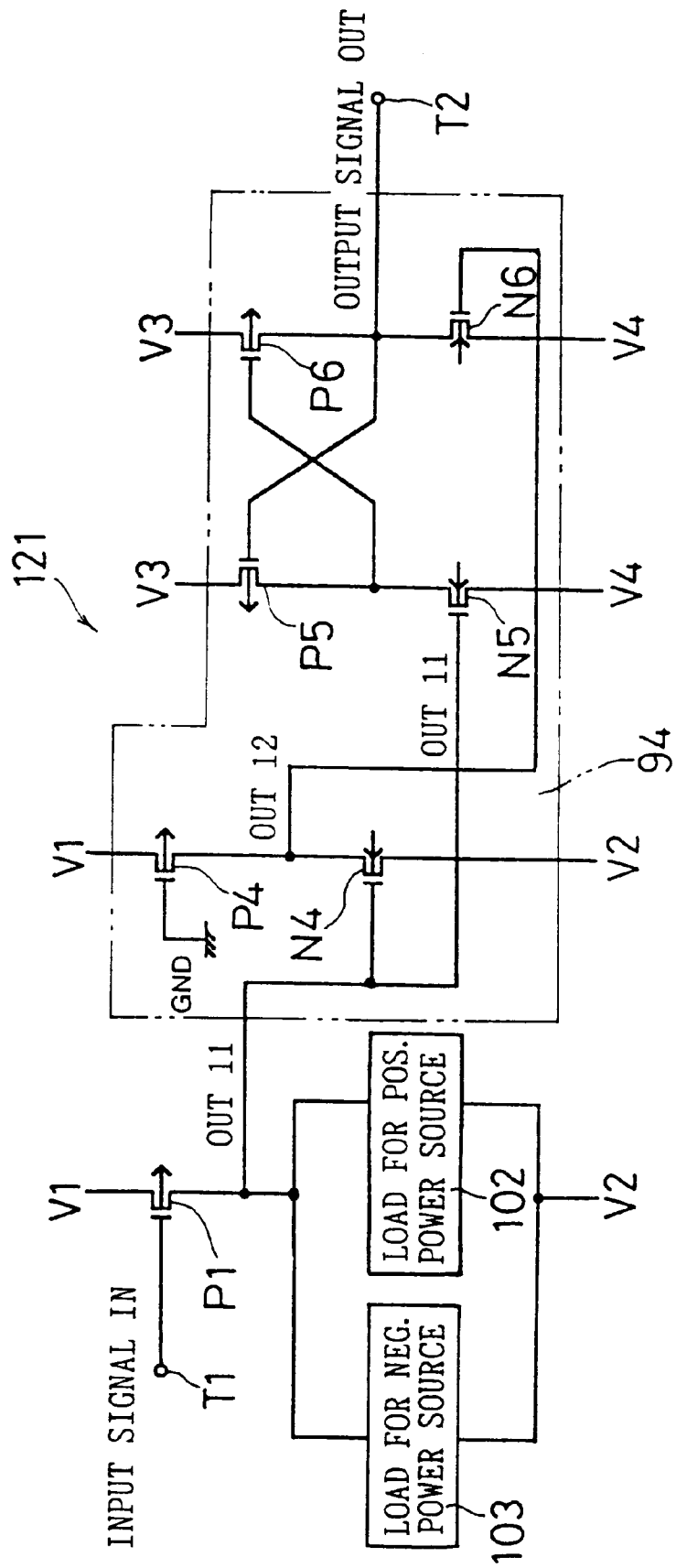
FIG. 16 is a circuit diagram of a level converting circuit 121.

FIGS. 14 to 16 are circuit diagrams for explaining other embodiments of the invention. Level converting circuits 101, 111, 121 of these embodiments are characterized in that loads are in parallel as an input loading element.

FIG. 14 is a circuit diagram of a level converting circuit 101. In the level converting circuit 101, elements identical to those in the level converting circuit 31 are given like reference characters and are not explained. The level converting circuit 101 comprises the P-channel MOS transistor P1, a positive power source load 102, a negative power source load 103 and an output circuit 34.

The transistor P1 which is an input switching element has a gate which is supplied with the input signal IN, a source which is supplied with voltage V1 of the first voltage level, and a drain which is supplied with voltage V2 of the second voltage level via the positive power source load 102 and the negative power source load 103 of the input loading element. The positive and negative power source loads 102 and 103 are connected to each other in parallel and to the drain of the transistor P in series. The drain voltage of the transistor P1 is supplied as the signal OUT1 to the gate of the transistor N2 in the output circuit 34.

Either the positive or the negative power source load operates as a load depending on which of voltages V1 and V3 is higher. In the case where the level converting circuit 101 is used in a positive power source specification, as shown in FIG. 4A, voltages V1 and V3 are determined to be equal to each other, and the positive power source load 102 operates as a load. On the other hand, in the case where the level converting circuit 101 is used in a negative power source specification, as shown in FIG. 4B, voltage V1 is determined to be higher than voltage V3, and the negative power source load operates as a load.

FIG. 15 is a circuit diagram of a level converting circuit 111. In the level converting circuit 111, elements identical to those in the level converting circuits 81 and 101 are given like reference characters and are not explained. The level converting circuit 111 comprises the P-channel MOS transistor P1, the positive power source load 102, the negative power source load 103 and the output circuit 34. The constitution of the input stage of the level converting circuit 111 is the same as that of the level converting circuit 101, and the signal OUT11 is supplied to each gate of the transistors P3 and N3 of the output circuit 84.

FIG. 16 is a circuit diagram of a level converting circuit 121. In the level converting circuit 121, elements identical to those in the level converting circuits 91 and 101 are given like reference characters and are not explained. The level converting circuit 121 comprises the P-channel MOS transistor P1, the positive power source load 102, the negative power source load 103 and the output circuit 94. The constitution of the input stage of the level converting circuit 121 is the same as that of the level converting circuit 101, and the signal OUT11 is supplied to each gate of the transistors N4 and N5 of the output circuit 94. A signal obtained by converting the signal level of the signal OUT11 is indicated as a signal OUT12. The signal OUT12 is supplied to the gate of the transistor N6.

Figure 17:
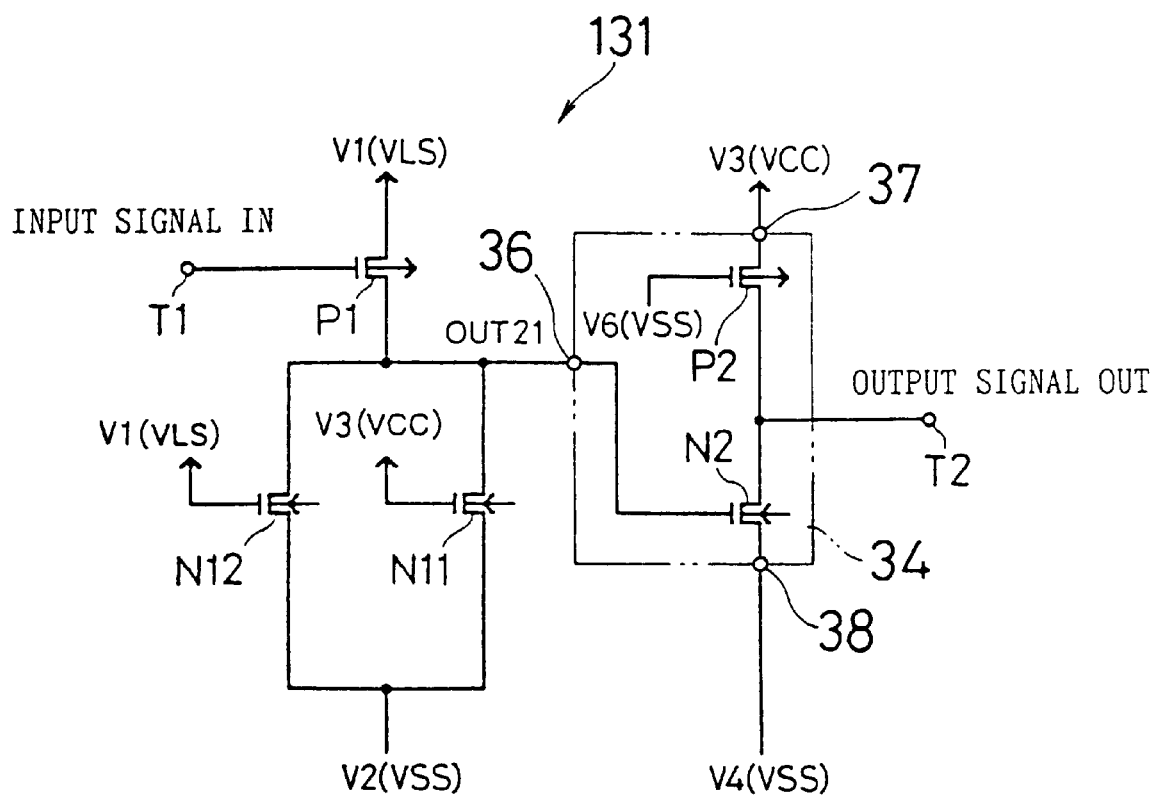
FIG. 17 is a circuit diagram showing a level converting circuit 131 of yet still another embodiment of the invention.
Figure 18A:
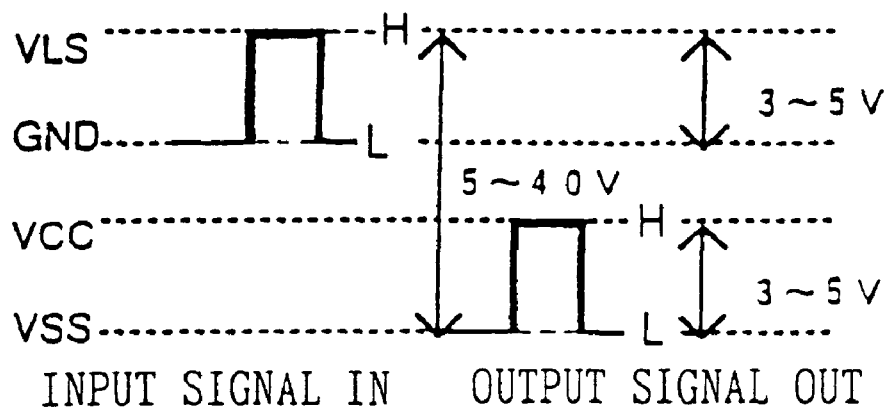
FIGS. 18A and 18B show relations of input and output of the level converting circuit 131.
Figure 18B:
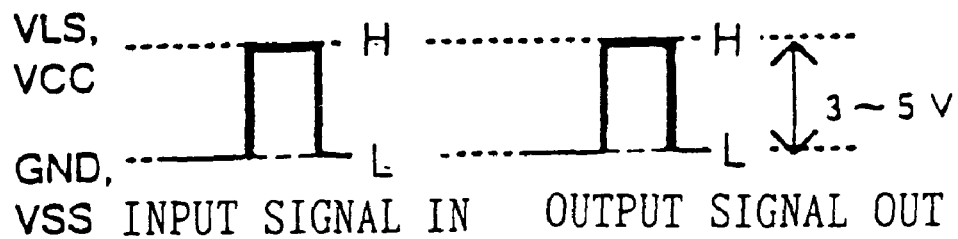

FIG. 17 is a circuit diagram showing a level converting circuit 131 of yet still another embodiment of the invention, and FIGS. 18A and 18B show relations of input and output of the level converting circuit 131.

In the level converting circuit 131, elements identical to those in the level converting circuit 31 are given like reference characters and are not explained. The level converting circuit 131 comprises the P-channel MOS transistor P1, N-channel MOS transistors N11 and N12 and the output circuit 34. The level converting circuit 131 is characterized in that the transistors N11 and N12 are provided as the positive power source load 102 and the negative power source load 103. In the level converting circuit 131, voltage VSS is supplied as voltages V2, V4 and V6, voltage VLS as voltage V1, and voltage VCC as voltage V3.

The transistor N11 has a drain connected to the drain of the transistor P1, a source which is supplied with voltage VSS, and a gate which is supplied with voltage VCC. The transistor N12 is connected to the transistor N11 in parallel, the gate is supplied with voltage VLS. The resistance values of the transistors N11 and N12 are set to be sufficiently large in comparison to the on-resistance of the transistor P1, and the transistors N11 and N12 operate as load transistors.

When voltages VLS and VCC are set to meet a relation of voltage VLS>>voltage VCC, the level converting circuit 131 is defined to be of the negative power source specification wherein the low level of the output signal OUT is negative. At that time, for example, voltage VLS is 5 V, voltage VCC is −20 V, and voltage VSS is −25 V. In this case, the input signal IN is a signal having an amplitude of 5 V which has a high level of voltage VLS and a low level of the ground voltage GND of 0 V.

When the level of the input signal IN is converted from the high level to the low level, the transistor P1 conducts and voltage VLS is supplied as the signal OUT21 to the output circuit 34. In the output circuit 34, since the signal level of the signal OUT21 is voltage VLS, voltage VSS is outputted as the output signal OUT. When the level of the input signal IN is converted from the low level to the high level, the transistor P1 is cut off. Since voltage VLS>>voltage VCC, the on-resistance of the transistor N12 becomes lower than that of the transistor N11, and the transistor N12 conducts. Voltage VSS is supplied as the signal OUT1 to the output circuit 34 via the transistor N12 in conduction state.

In the case of the negative power source specification, as shown in FIG. 18A, for example, a voltage between the voltages VLS and VSS is set in a range of 5 to 40 V, a voltage between voltages VLS and GND is set in a range of 3 to 5 V, and a voltage between voltages VCC and VSS is set in a range of 3 to 5 V. The high and low levels of the input signal IN are voltage VLS and voltage GND, respectively. The high and low levels of the output signal OUT which is an output of the level converting circuit 131 are voltage VCC and voltage VSS, respectively.

When voltages VLS and VCC are set to meet a relation of voltage VLS=voltage VCC, the level converting circuit 131 is defined to be of the positive power source specification wherein the low level of the output signal OUT is the ground voltage GND. At that time, for example, voltages VLS and VCC are 5 V, and voltage VSS is 0 V.

In the case of the positive power source specification, since the on-resistance of the transistor N11 is set to be sufficiently smaller than the on-resistance of the transistor N12, mainly the transistor N11 operates as a load transistor. Since the signal level of the signal OUT1 is the same as in the negative power source specification, the explanation thereof is omitted. In the positive power source specification, as shown in FIG. 18B, for example, the voltages between voltages VLS and GND, between voltages VLS and VSS, and between voltages VCC and VSS are set to be in the range of 3 to 5 V. The input signal IN and the output signal OUT are the same in the negative power source specification and are not explained.

Figure 19:
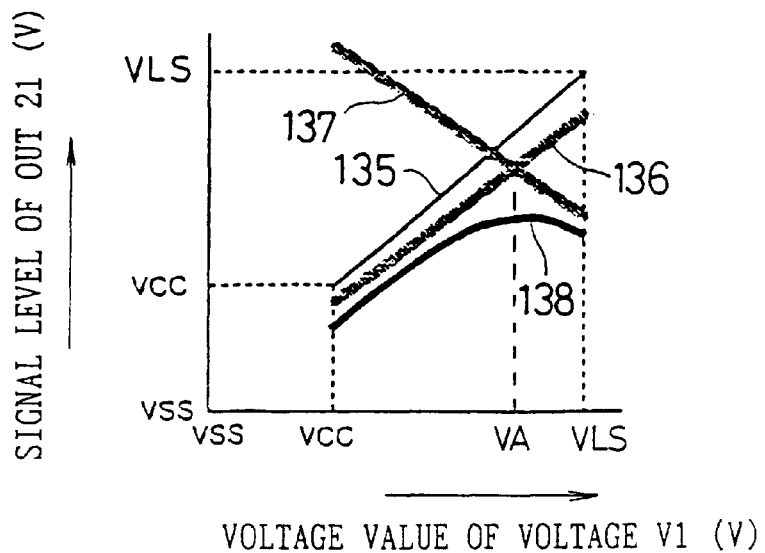
FIG. 19 shows relations between voltage values of voltage VLS and signal levels of a signal OUT21.

FIG. 19 shows relations between voltage values of voltage V1 and signal levels of a signal OUT21. Suppose that the voltage value of voltage V1 changes from voltage VCC to voltage VLS, as shown in characteristic line 135. When the voltage value of voltage VLS equals voltage VCC, the level converting circuit 131 is of the positive power source specification, and when the voltage value of voltage VLS is equal to voltage VLS, the level converting circuit 131 is of the negative power source specification.

In the level converting circuit 131, changes of the signal OUT21 in signal level when only the transistor N11 which is the positive power source load is provided are shown in characteristic line 136. The characteristic line 136 is the same as the characteristic line 47 of FIG. 7. Additionally changes of the signal OUT21 in signal level when only the transistor N12 which is the negative power source load is provided are shown in characteristic line 137. When only the transistor N12 is provided, as the voltage value of voltage V1 changes from voltage VCC to voltage VLS, the signal level of the signal OUT21 is lowered. When voltage V1 becomes voltage VA in the range between voltage VCC and voltage VSS, the characteristic lines 136 and 137 are of the same signal level. The voltage value VA which is an intersecting point of the characteristic lines 136 and 137 is determined by the resistance values of the transistors N11 and N12 which are in conduction state.

Changes of the signal OUT21 in signal level in the case where the transistors N11 and N12 are provided is shown in a characteristic line 138. In the level converting circuit 131, since both the transistors N11 and N12 are provided, the signal level of the signal OUT21 is determined on the basis of a lower one in level of the characteristic lines 136 and 137. Accordingly, the characteristic line 138 changes along the characteristic line 136 in the case where voltage V1 changes from voltage VCC to voltage VA, and it changes along the characteristic line 137 in the case where voltage V1 changes from voltage VA to voltage VLS. When voltage VLS has a voltage value beyond voltage value VA, the signal level of the signal OUT21 is determined on the basis of a current flow through the transistor N12, resulting in preventing the signal level from increasing.

Figure 20:
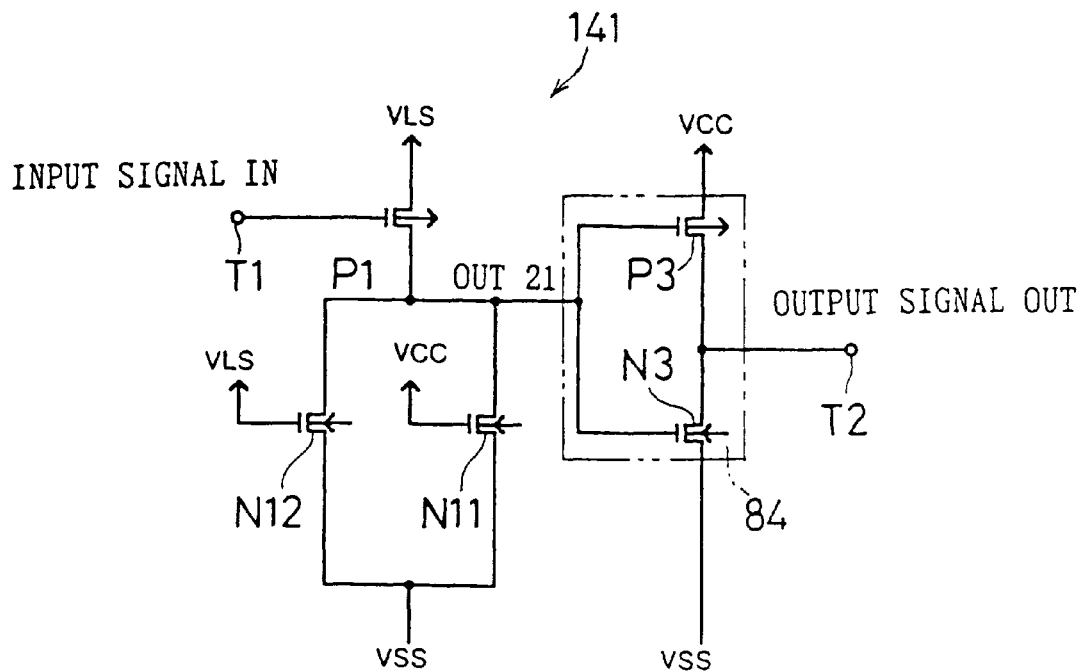
FIG. 20 is a circuit diagram of a level converting circuit 141 of further another embodiment.

FIG. 20 is a circuit diagram of a level converting circuit 141 of yet another embodiment. In the level converting circuit 141, elements identical to those in the level converting circuits 131 are given like reference characters and are not explained. The level converting circuit 141 comprises the P-channel MOS transistor P1, N-channel MOS transistors N11 and N12 and the output circuit 84. The input stage constitution of the level converting circuit 141 is the same as that in the level converting circuit 131, and the signal OUT21 is supplied to the gates of the transistors P3 and N3 of the output circuit 84.

Figure 21:
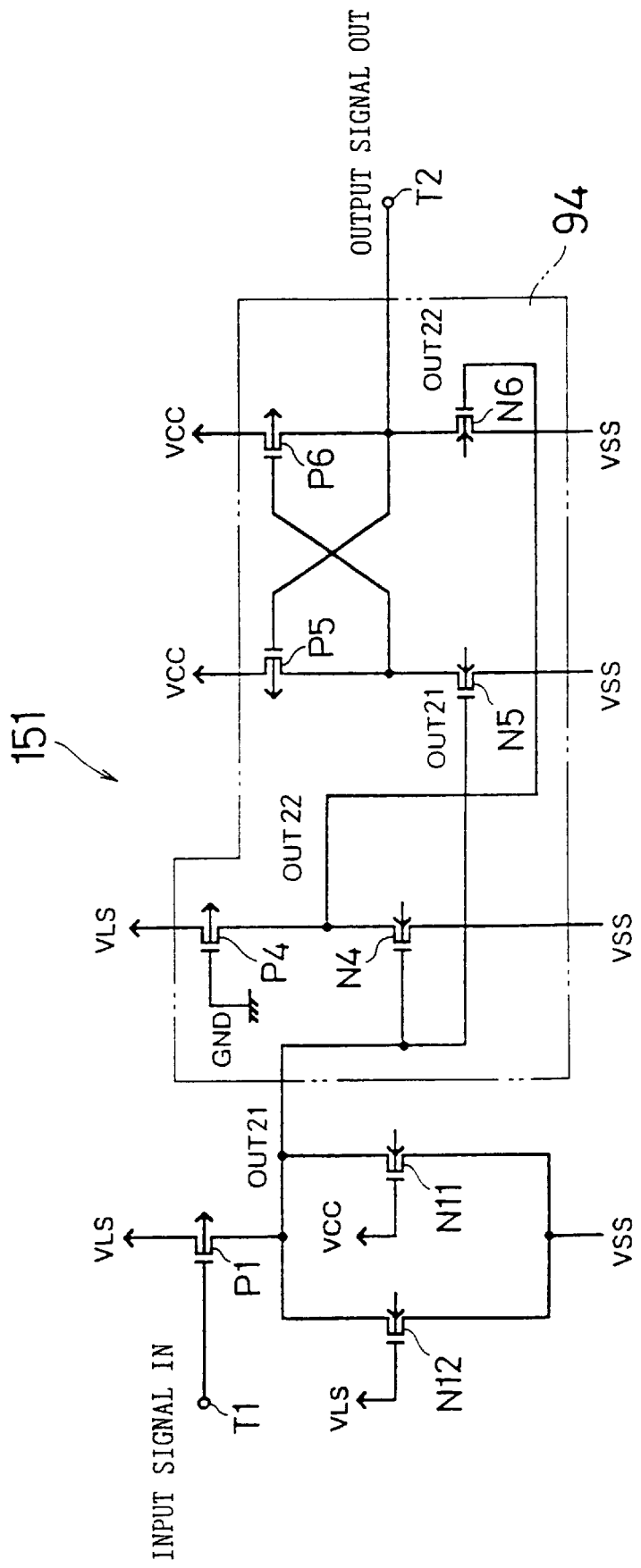
FIG. 21 is a circuit diagram of a level converting circuit 151 of further another embodiment.

FIG. 21 is a circuit diagram of a level converting circuit 151 of further another embodiment. In the level converting circuit 151, elements identical to those in the level converting circuits 131 are given like reference characters and are not explained. The level converting circuit 151 comprises the P-channel MOS transistor P1, N-channel MOS transistors N11 and N12 and the output circuit 94. The input stage constitution of the level converting circuit 151 is the same as that in the level converting circuit 131, and the signal OUT21 is supplied to the gates of the transistors N4 and N5 of the output circuit 94.

Although the transistors P4 and N4 of the output circuit 94 are of a constitution similar to that of the transistors P2 and N2 of the output circuit 34, the transistor P4 has a gate which is supplied with the ground voltage GND, and a source which is supplied with voltage VLS. The signal level of the signal OUT22 which is a voltage at the connection point of the transistors P4 and N4 is either one of voltages VLS and VSS. The signals OUT21 and OUT22 have signal levels converted from each other.

Since the signals OUT21 and OUT22 are supplied to the gate of the transistor N5 and to the gate of the transistor N6, either one of the transistors N5 and N6 conducts, and the other is cut off. By the transistors N5 and N6, conduction and cutoff of the transistors P5 and P6 is controlled, the signal level of the output signal OUT is determined.

Figure 22:
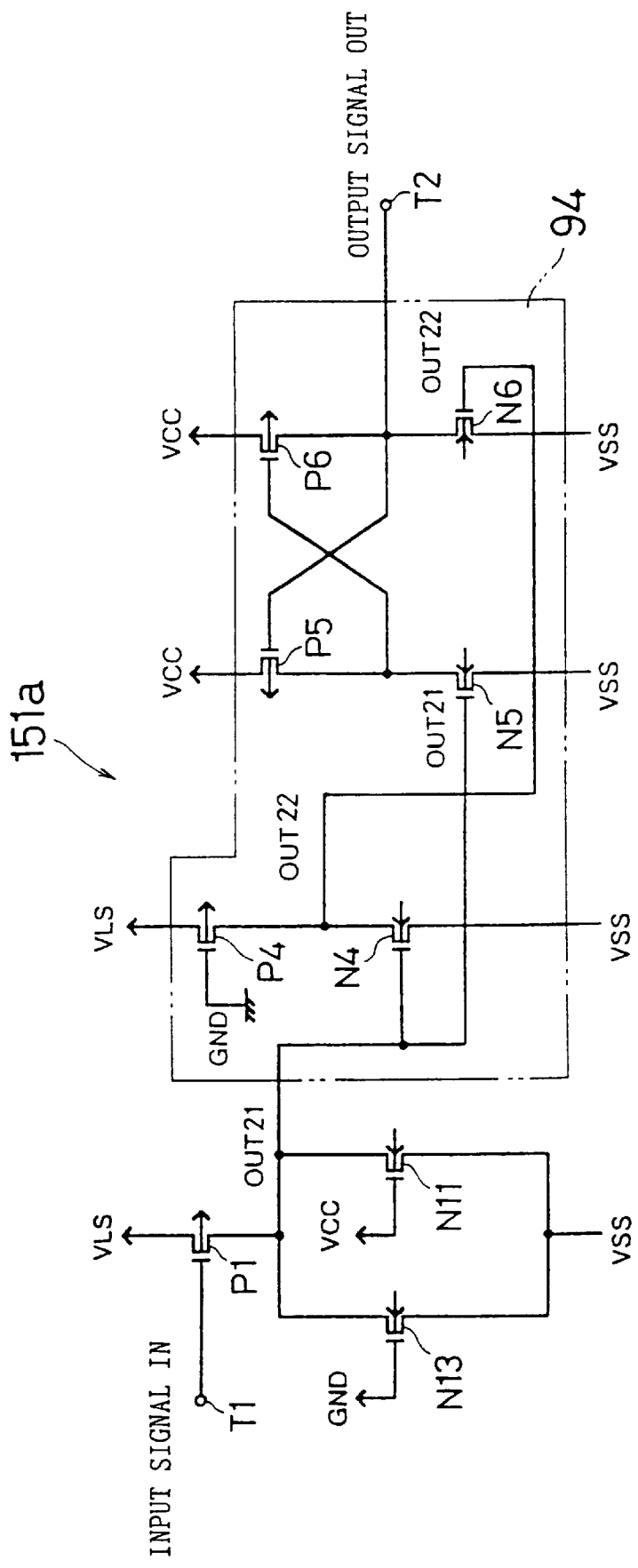
FIG. 22 is a circuit diagram of a level converting circuit 151a similar to the level converting circuit 151.

FIG. 22 is a circuit diagram of a level converting circuit 151a similar to the level converting circuit 151. In the level converting circuit 151a, a transistor N13 whose gate is supplied with the ground voltage GND is provided in lieu of the transistor N12 in the level converting circuit 151. The operation of the level converting circuit 151a is the same as that of the level converting circuit 151.

As mentioned above, according to the embodiments of FIGS. 11, 12, and 14 to 22, a similar effect to that of each embodiment of FIGS. 1 to 7 and FIGS. 8 to 10 can be obtained, and since in the level converting circuits 131, 141, 151 and 151a of FIGS. 17 to 22 the transistor N12, N13 which serves as a load in operation in the negative power source specification is provided in parallel to the transistor N11, electric charge stored in the condenser C equivalently shown, which is described in relation to FIG. 13, can be promptly discharged, resulting in shortening a signal delay time when the input signal IN rises.

Figure 23:
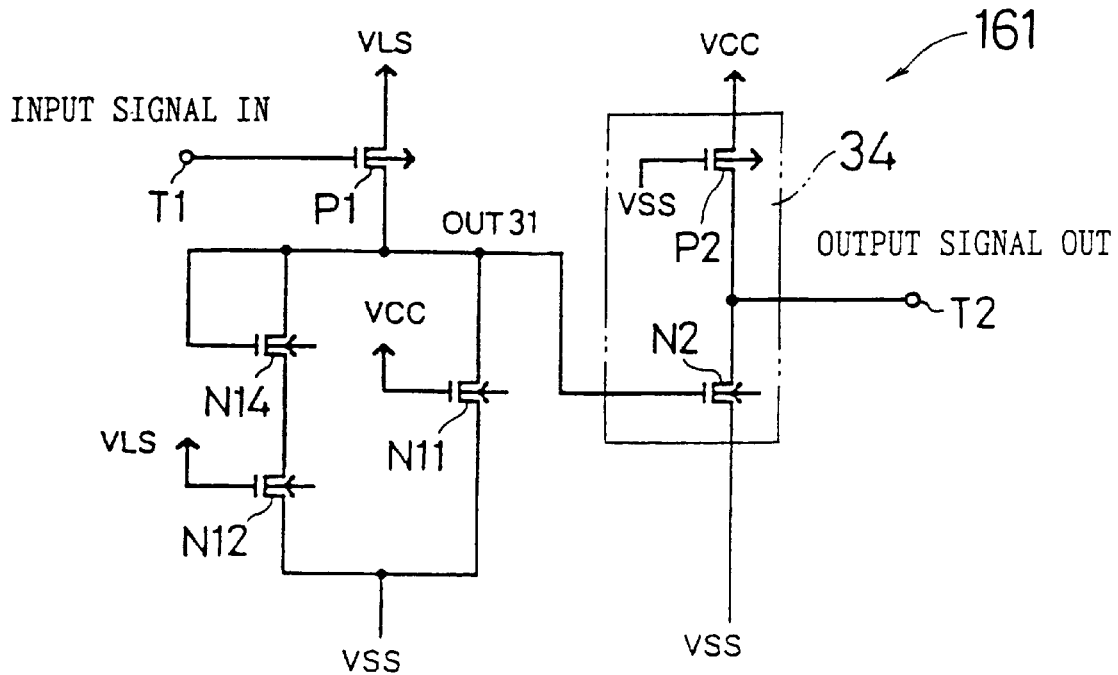
FIG. 23 is a circuit diagram showing a level converting circuit 161 of further another embodiment of the invention.

FIG. 23 is a circuit diagram showing a level converting circuit 161 of further another embodiment of the invention. In the level converting circuit 161, elements identical to those in the level converting circuits 131 are given like reference characters and are not explained. The level converting circuit 161 comprises the P-channel MOS transistor P1, N-channel MOS transistors N11, N12 and N 14 and the output circuit 34.

The level converting circuit 161 is characterized in that the transistor N14 which serves as a resistance is provided in series between the drains of the transistors N12 and P1. The source of the transistor N14 is connected to the drain of the transistor N12, and the drain and gate of the transistor N14 are connected.

The operations of the transistors N11 and N12 of the level converting circuit 161 are the same as those of the level converting circuit 131, and are not explained. In the level converting circuit 161, the transistor N14 is connected in series to the transistor N12, and the resistance value as a negative power source load increases. The drain voltage of the transistor P1 is supplied as a signal OUT 31 to the gate of the transistor N2 of the level converting circuit 34.

Figure 24:
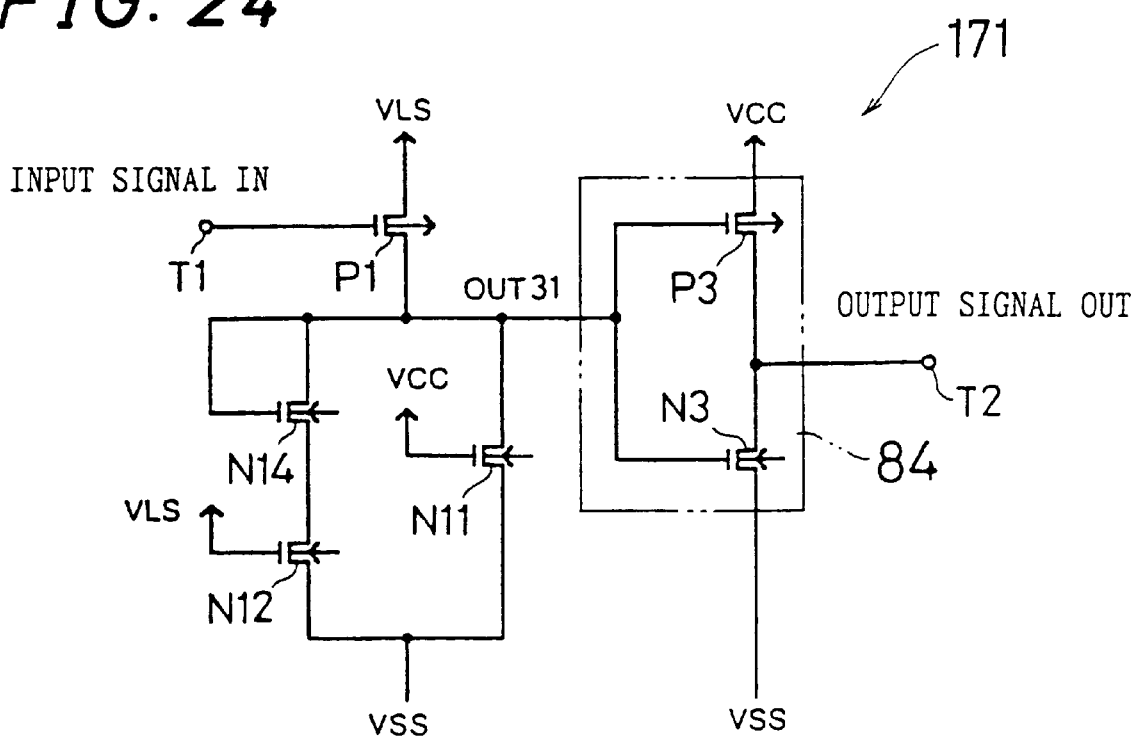
FIG. 24 is a circuit diagram of a level converting circuit 171 of further another embodiment.

FIG. 24 is a circuit diagram of a level converting circuit 171 of further another embodiment. In the level converting circuit 171, elements identical to those in the level converting circuits 161 are given like reference characters and are not explained. The level converting circuit 171 comprises the P-channel MOS transistor P1, N-channel MOS transistors N11, N12 and N14 and the output circuit 84. The constitution of the input stage of the level converting circuit 171 is the same as that of the level converting circuit 161, and the signal OUT31 is supplied to the gates of the transistors P3 and N3 of the output circuit 84.

Figure 25:
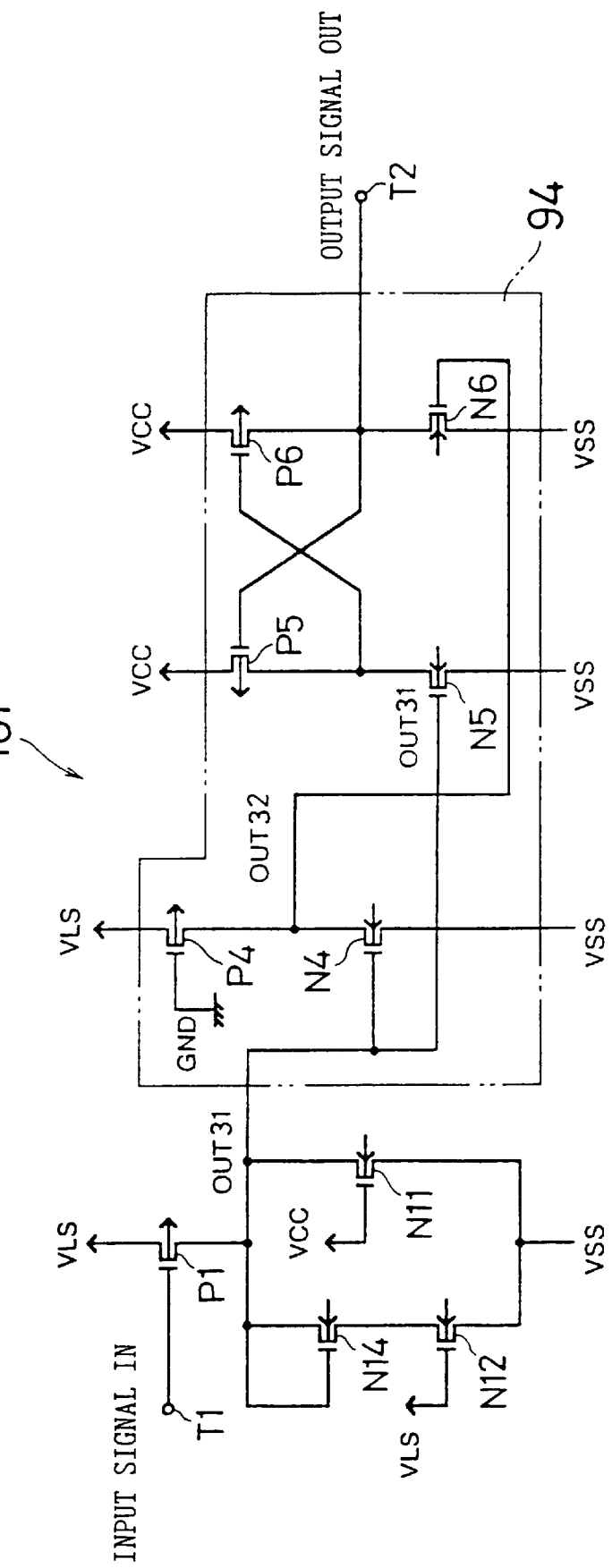
FIG. 25 is a circuit diagram of a level converting circuit 181 of further another embodiment.

FIG. 25 is a circuit diagram of a level converting circuit 181 of further another embodiment. In the level converting circuit 181, elements identical to those in the level converting circuits 161 are given like reference characters and are not explained. The level converting circuit 181 comprises the P-channel MOS transistor P1, N-channel MOS transistors N11, N12 and N14 and the output circuit 94. The constitution of the input stage of the level converting circuit 181 is the same as that of the level converting circuit 161, and the signal OUT31 is supplied to the gates of the transistors N4 and N5 of the output circuit 94. A signal OUT32 which has a signal level converted from the signal level of the signal OUT31 is supplied to the gate of the transistor N6.

Figure 26:
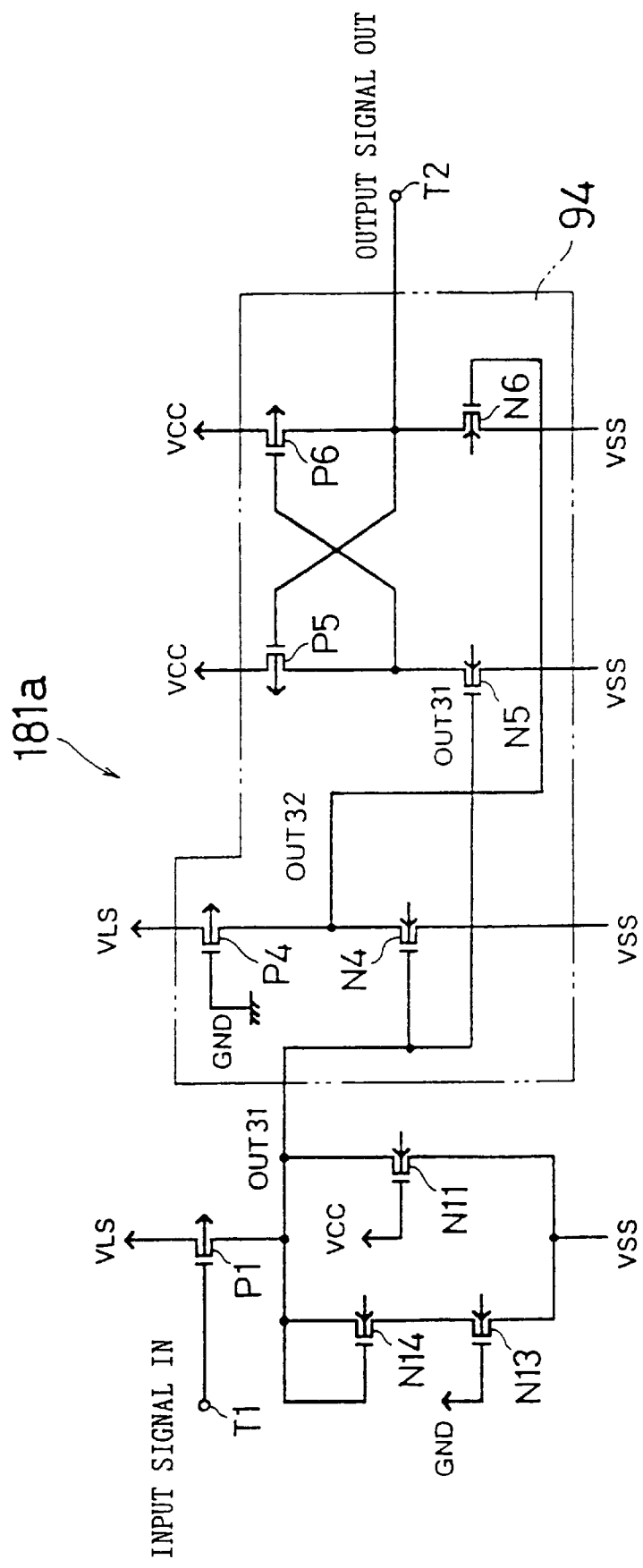
FIG. 26 is a circuit diagram of a level converting circuit 181a similar to the level converting circuit 181.

FIG. 26 is a circuit diagram of a level converting circuit 181a similar to the level converting circuit 181. In the level converting circuit 181a, a transistor N13 whose gate is supplied with the ground voltage GND is provided in lieu of the transistor N12 in the level converting circuit 181. The operation of the level converting circuit 181a is the same as that of the level converting circuit 181.

As mentioned above, according to the embodiments of FIGS. 23 to 26, similar effects to those of the embodiments of FIGS. 1 to 7 and FIGS. 8 to 10 can be obtained, and since the transistor N14 which serves as a resistance is provided in series to the transistor N12, N13 whose resistance in conduction state changes depending on whether the power source specifications of the level converting circuits 161, 171, 181 and 181a are positive or negative, the value of a composite resistance in operation in the negative power source specification can be controlled by the resistance value of the transistor N14. Additionally in the case of the positive power source specification the transistor N14 can lower the signal level of the signal OUT1, the margin for input conversion level can be increased. Since the transistor N14 operates as a resistance, the level converting circuit can be small-sized in comparison to the formation of a resistance of the same resistance value.

Figure 27:
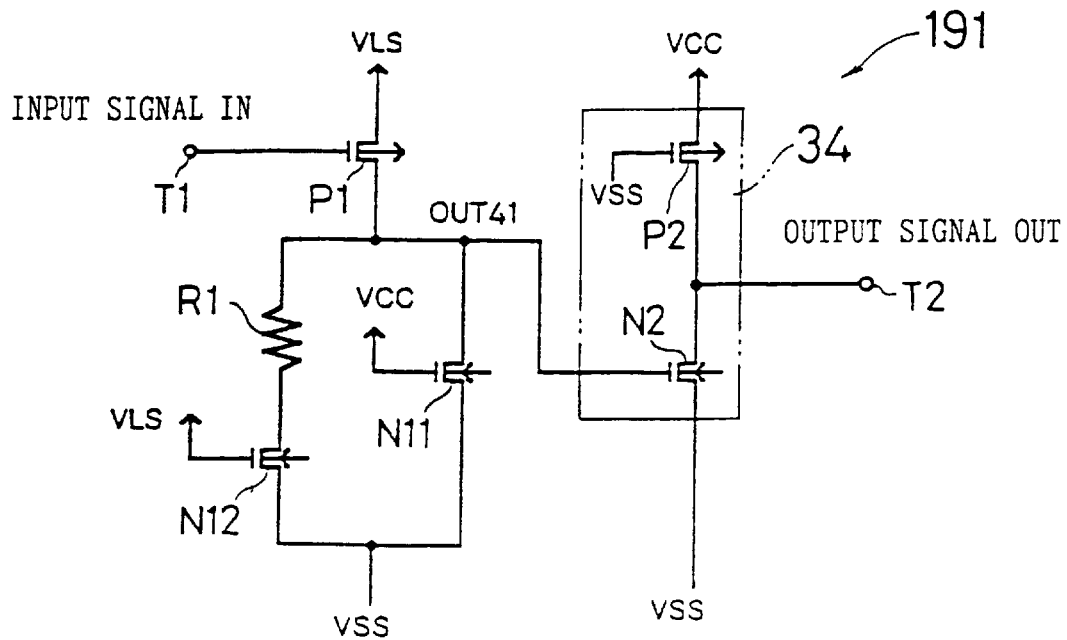
FIG. 27 is a circuit diagram showing a constitution of a level converting circuit 191 of further another embodiment of the invention.

FIG. 27 is a circuit diagram showing a constitution of a level converting circuit 191 of a fourth embodiment of the invention. In the level converting circuit 191, elements identical to those in the level converting circuits 31 are given like reference characters and are not explained. The level converting circuit 191 comprises the P-channel MOS transistor P1, N-channel MOS transistors N11 and N12, a resistance R1, and the output circuit 34.

The level converting circuit 191 is characterized in that between the drains of the transistors N12 and P1 the resistance R1 is provided in series to the transistor N12. The operations of the transistors N11 and N12 in the level converting circuit 191 are the same as that of the level converting circuit 131, and are not explained. In the level converting circuit 191, the resistance R1 is connected in series to the transistor N12, the resistance value as a negative power source load increases. The drain voltage of the transistor P1 is supplied as a signal OUT41 to the gate of the transistor N2 of the output circuit 34.

Figure 28:
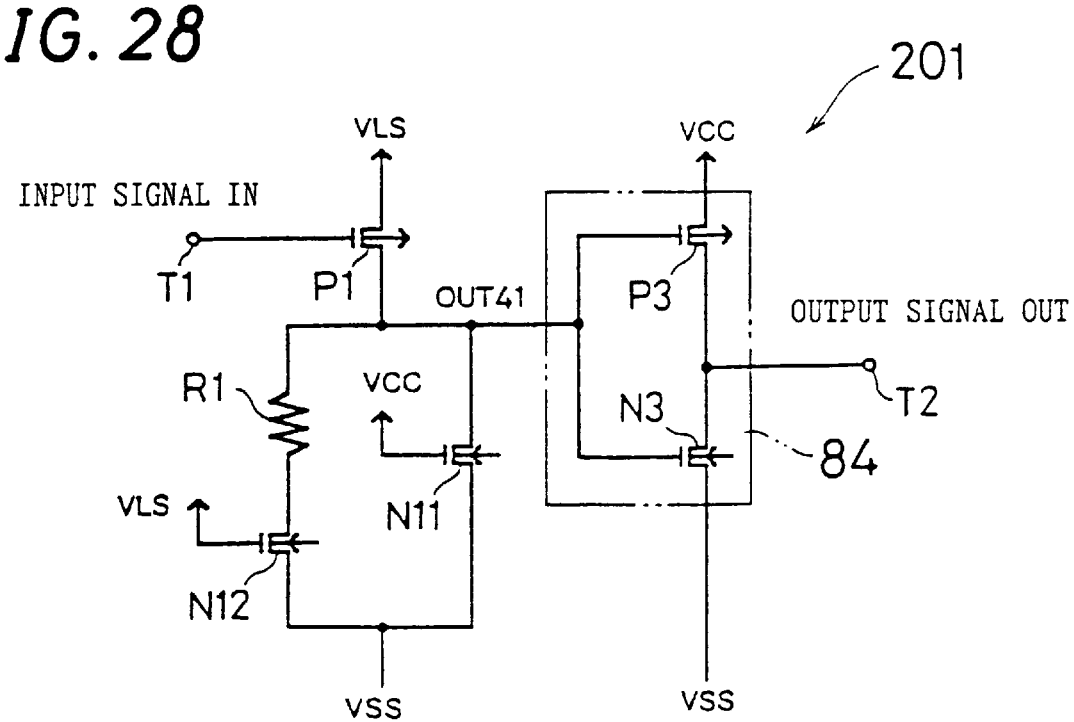
FIG. 28 is a circuit diagram of a level converting circuit 201 of further another embodiment.

FIG. 28 is a circuit diagram of a level converting circuit 201 of another constitution of the fourth embodiment. In the level converting circuit 201, elements identical to those in the level converting circuits 191 are given like reference characters and are not explained. The level converting circuit 201 comprises the P-channel MOS transistor P1, N-channel MOS transistors N11 and N12, the resistance R1 and the output circuit 84. The constitution of the input stage of the level converting circuit 201 is the same as that of the level converting circuit 191, and the signal OUT 41 is supplied to the gates of the transistors N3 and P3 of the output circuit 84.

Figure 29:
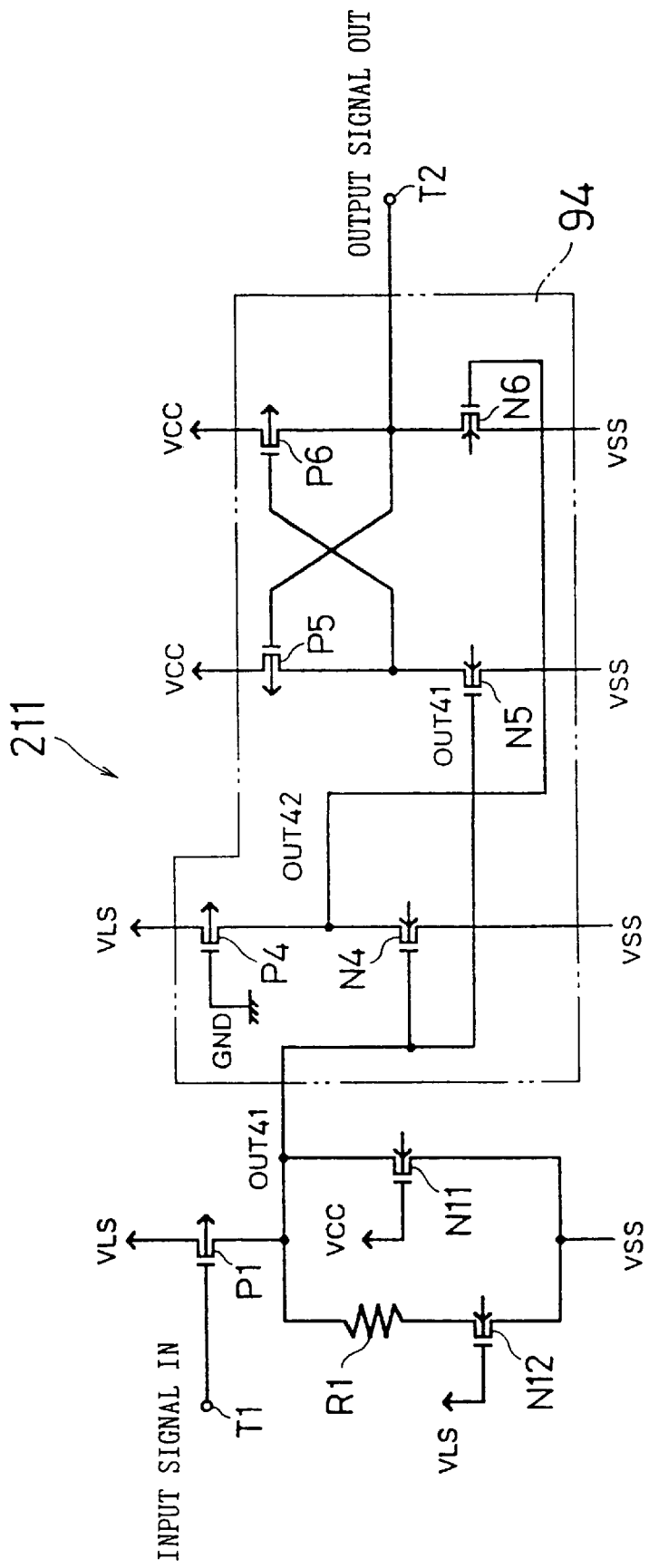
FIG. 29 is a circuit diagram of a level converting circuit 211 of further another embodiment.

FIG. 29 is a circuit diagram of a level converting circuit 211 of still another constitution of the fourth embodiment. In the level converting circuit 211, elements identical to those in the level converting circuits 191 are given like reference characters and are not explained. The level converting circuit 211 comprises the P-channel MOS transistor P1, N-channel MOS transistors N11 and N12, the resistance R1 and the output circuit 94. The constitution of the input stage of the level converting circuit 211 is the same as that of the level converting circuit 191, and the signal OUT41 is supplied to the gates of the transistors N4 and N5 of the output circuit 94. A signal OUT42 which has a signal level converted from the signal level of the signal OUT41 is supplied to the gate of the transistor N6.

Figure 30:
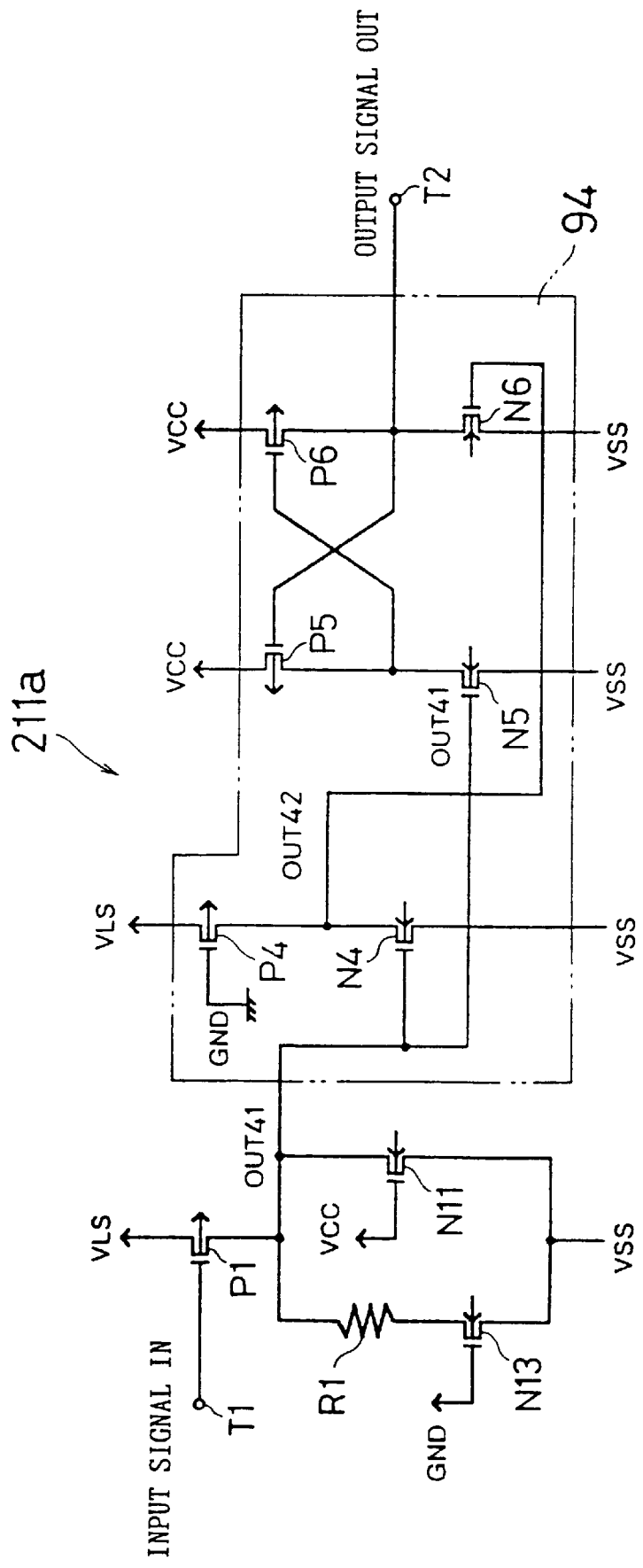
FIG. 30 is a circuit diagram of a level converting circuit 211a similar to the level converting circuit 211.

FIG. 30 is a circuit diagram of a level converting circuit 211a similar to the level converting circuit 211. In the level converting circuit 211a, a transistor N13 whose gate is supplied with the ground voltage GND is provided in lieu of the transistor N12 in the level converting circuit 211. The operation of the level converting circuit 211a is the same as that of the level converting circuit 211.

As mentioned above, according to the embodiments of FIGS. 27 to 30, similar effects to those of the embodiments of FIGS. 1 to 7 and FIGS. 8 to 10 can be obtained, and since the resistance R1 is provided in series to the transistor N12, N13 whose resistance in conduction state changes depending on whether the power source specifications of the level converting circuits 191, 201, 211 and 211a are positive or negative, the value of a composite resistance in operation in the negative power source specification can be determined by controlling the resistance value of the resistance R1. Additionally in the case of the positive power source specification the transistor N14 can lower the signal level of the signal OUT1, the margin for input conversion level can be increased.

Figure 31:
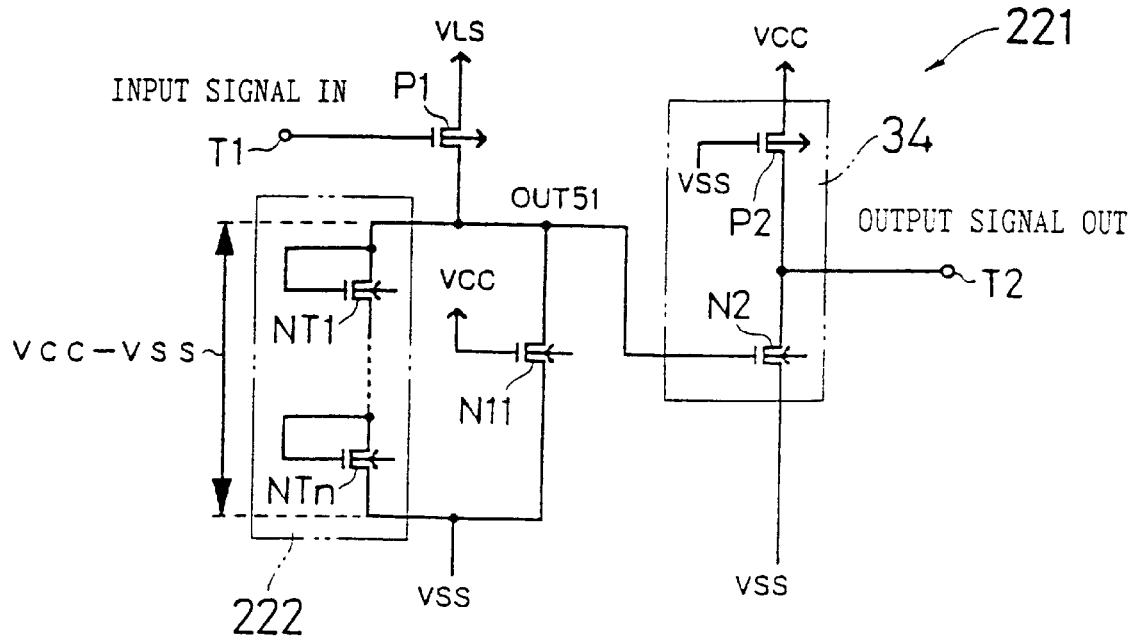
FIG. 31 is a circuit diagram showing a constitution of a level converting circuit 221 of further another embodiment of the invention.

FIG. 31 is a circuit diagram showing a level converting circuit 221 of further another embodiment of the invention. In the level converting circuit 221, elements identical to those in the level converting circuits 101 are given like reference characters and are not explained. The level converting circuit 221 comprises the P-channel MOS transistor P1, N-channel MOS transistor N11, a resistance circuit 222, and the output circuit 34. The level converting circuit 221 is characterized in that the resistance circuit 222 is provided in parallel to the transistor N11.

The resistance circuit 222 is composed of n resistance-connection N-channel MOS transistors NT1 to NTn (n is an integer of 2 or more, and the transistors are generically referred to with a reference character NT) which are connected in series to each other. The number n of the transistors connected in series to each other is determined on the following formula:

$$n \times Vth = VCC - VSS \quad (11)$$

wherein Vth is a threshold voltage of each transistor NT.

The transistors NT connected in series to each other operate as a resistance when the signal level of a signal OUT51 becomes higher than voltage VCC.

Figure 32:
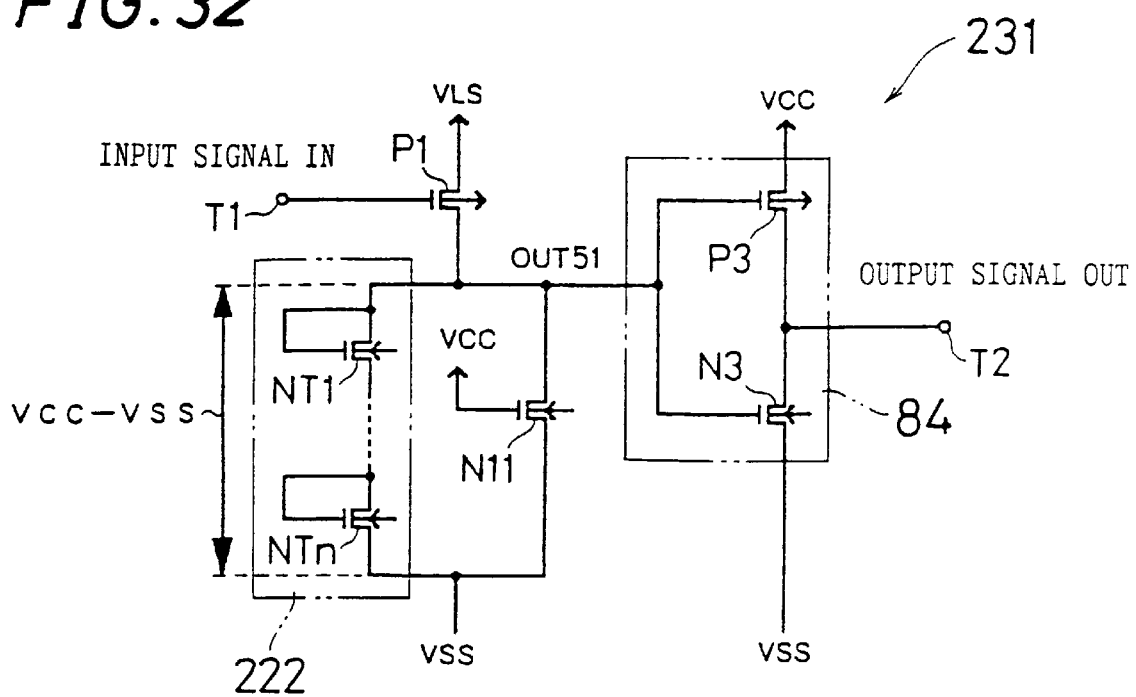
FIG. 32 is a circuit diagram of a converting circuit 231 of further another embodiment.

FIG. 32 is a circuit diagram of a converting circuit 231 of further another constitution of the fifth embodiment. In the level converting circuit 231, elements identical to those in the level converting circuits 111 are given like reference characters and are not explained. The level converting circuit 231 comprises the P-channel MOS transistor P1, the N-channel MOS transistor N11, the resistance circuit 222 and the output circuit 84. The constitution of the input stage of the level converting circuit 231 is the same as that of the level converting circuit 221, and the signal OUT51 is supplied to the gates of the transistors P3 and N3 of the output circuit 84.

Figure 33:
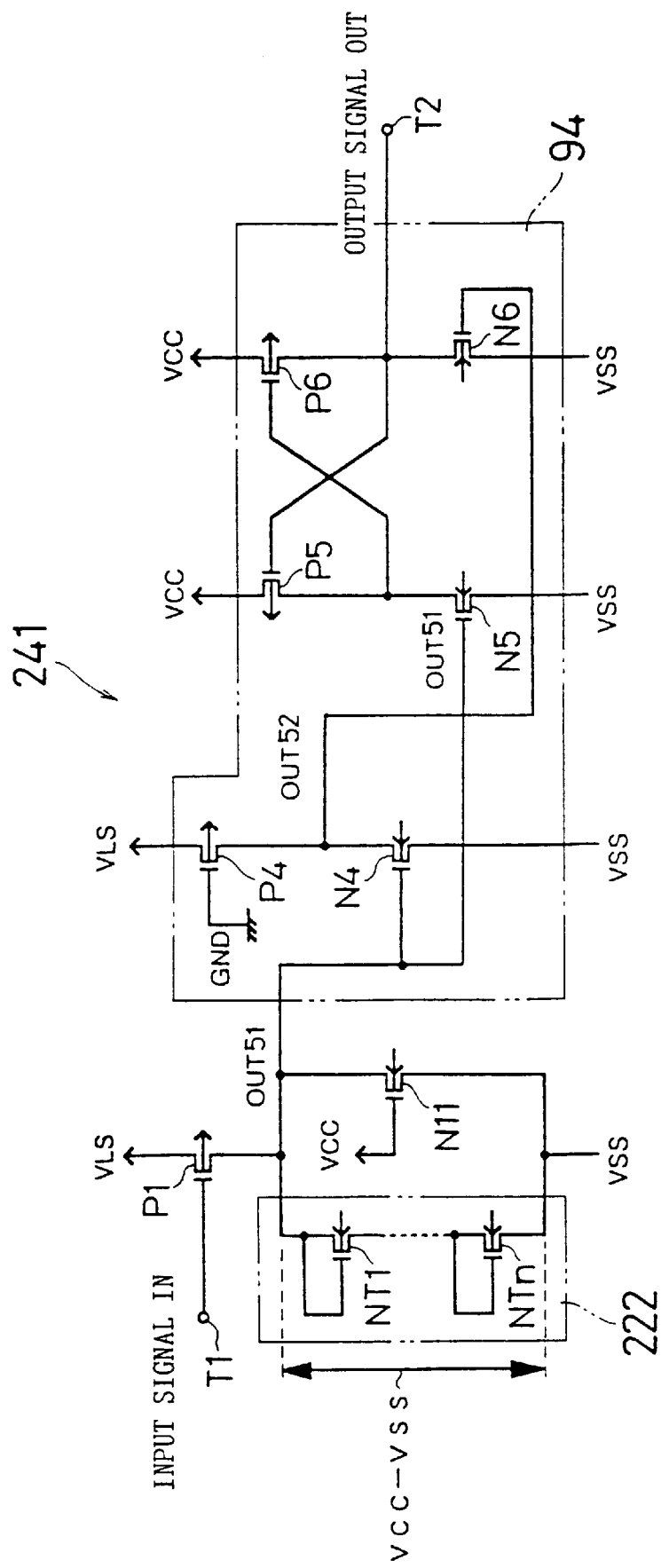
FIG. 33 is a circuit diagram of a level converting circuit 241 of further another embodiment.

FIG. 33 is a circuit diagram of a level converting circuit 241 of further another embodiment. In the level converting circuit 241, elements identical to those in the level converting circuits 121 are given like reference characters and are not explained. The level converting circuit 241 comprises the P-channel MOS transistor P1, the N-channel MOS transistor N11, a resistance circuit 222 and the output circuit 94. The constitution of the input stage of the level converting circuit 241 is the same as that of the level converting circuit 221, and the signal OUT 51 is supplied to the gates of the transistors N4 and N5 of the output circuit 94. A signal OUT52 which has a signal level converted from the signal level of the signal OUT51 is supplied to the gate of the transistor N6.

As mentioned above, according to the embodiments of FIGS. 31 to 33, similar effects to those of the embodiments of FIGS. 1 to 7 and FIGS. 8 to 10 can be obtained, and since, even when it is necessary in operation of the negative power source specification that the resistance value of a resistance provided in parallel to the transistor N11 is determined to be large because the difference between voltages VCC and VSS is large, a resistance having a desired resistance value is formed by connecting the plural transistors serving as a resistance in series, resulting in size reduction of the integrated circuit substrate.

Additionally, in the embodiments, since a high voltage is not applied to the transistors P1, N1 etc. constituting the input stage, a constitution of a low breakdown voltage can be used for the transistors, and consequently the circuit part is small-sized in comparison to that of an input stage to which a voltage of 20 to 40 V is applied. As a result the size of the level converting circuit can be reduced. Furthermore, by using a so-called medium breakdown voltage constitution capable of operating even when a voltage of 20 to 40 V is applied, for the transistors of the input and output stages constituting the level converting circuit, nonuniformity between the input and output stages in characteristic can be prevented in comparison to the constitution where the breakdown voltages of the input and output stages are different.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A level converting circuit for converting an input signal having a first reference voltage level supplied to a signal input terminal into a converted signal having a second reference voltage level, a level of the input signal changing within an amplitude having the first reference voltage level and a predetermined voltage level, comprising:

an input loading element;

an input switching element provided with first and second output electrodes and a control electrode, the first output electrode being connected to a power source voltage of a first voltage level, the second output electrode being connected to a power source voltage of a second voltage level via the input loading element, and the control electrode being connected to the signal input terminal, the input switching element for outputting a signal of the first or second voltage level depending on whether the input signal is of the first reference voltage level or of the predetermined voltage level; and an output switching element provided with first and second power source terminals, a signal output terminal and a control terminal, the first power source terminal being supplied with a power source voltage of a third voltage level, the second power source terminal being connected to a power source voltage of a fourth voltage level different from the third voltage level, and the control terminal being connected to the second output electrode of said input switching element, the output switching element for outputting a signal of the third or fourth level from the signal output terminal as the converted signal, depending on whether the voltage level of the signal output from the input switching element is of the first or second level, the input loading element having first and second electrodes and a second control electrode, the first electrode being connected to the power source voltage of the second voltage level, the second electrode being connected to the second output electrode of the input switching element, and the second control electrode being connected to the power source voltage of the first or third voltage level.

2. The level converting circuit of claim 1, wherein said input loading element comprises:

first loading means for operating as an input load when the first reference voltage level is chosen to be equal to the second reference voltage level; and second loading means connected in parallel to the first loading means for operating as an input load when the first reference voltage level is different from the second reference voltage level.

3. The level converting circuit of claim 2, wherein a resistance value of said second loading means is larger than a resistance value of said first loading means when the first reference voltage level is chosen to be equal to the second reference voltage level, and the resistance value of said first loading means is larger than the resistance value of said second loading means when the first reference voltage level is chosen to be different from the second reference voltage level.

4. The level converting circuit of claim 2, wherein said first loading means is provided with first and second electrodes and a second control electrode, and the first electrode is connected to the power source voltage of the second voltage level, the second electrode is connected to the second output electrode of the input switching element, and the second control electrode is connected to the power source voltage of the third voltage level to conduct between the first and the second electrodes of the first loading means.

5. The level converting circuit of claim 2, wherein said second loading means is provided with first and second electrodes and a second control electrode, and the first electrode is connected to the power source voltage of the second voltage level, the second electrode is connected to the second output electrode of said input switching element, and the second control electrode is connected to the power source voltage of the first voltage level to conduct between the first and the second electrodes of the second loading means.

6. The level converting circuit of claim 1, wherein said output switching element comprises:

a switching element provided with third and fourth output electrodes and a second control electrode, wherein the third output electrode is connected to the second power source terminal, the fourth output electrode is connected to the signal output terminal, and the second control electrode of said switching element is connected to the control terminal; and output loading means connected between the fourth output electrode of said switching element and the first power source terminal.

7. The level converting circuit of claim 1, wherein said output switching element comprises:

a first switching element provided with third and fourth output electrodes and a second control electrode, wherein the third output electrode is connected to the first power source terminal, the fourth output electrode is connected to the signal output terminal, and the second control electrode of the first switching element is connected to the control terminal; and a second switching element which is a complementary conductive type element to said input switching element and is provided with fifth and sixth output electrodes and a third control electrode, wherein the fifth output electrode is connected to the second power source terminal, the sixth output electrode is connected to the signal output terminal, and the third control electrode is connected to the control terminal.

8. The level converting circuit of claim 1, wherein said output switching element comprises:

a first switching element which is a same conductive type element as said input switching element and is provided with third and fourth output electrodes and a second control electrode, wherein the third output electrode is connected to the power source voltage of the first voltage level and the second control electrode of said first switching element is supplied with a voltage of the first reference voltage level of the input signal, so that said first switching element is continuously in a conduction state;

a second switching element which is a complementary conductive type element to said first switching element and is provided with fifth and sixth output electrodes and a third control electrode, wherein the fifth output electrode is connected to the power source voltage of the second voltage level, the sixth output electrode is connected to the fourth output electrode of said first switching element, and the third control electrode is connected to the control terminal; and a bridge circuit including third and fourth switching elements of the same conductive type as said first switching element each having respective seventh and eighth output electrodes and a respective control electrode and including fifth and sixth switching elements of the same conductive type as said second switching element each having respective ninth and tenth output electrodes and a respective control electrode, wherein the ninth output electrode of each of the fifth and sixth switching elements are connected to the second power source terminal, the seventh output electrode of each of the third and fourth switching elements are connected to the first power source terminal, the eighth and tenth output electrodes of the third and fifth switching elements and the control electrode of the fourth switching element are connected in common, the eighth and tenth output electrodes of the fourth and sixth switching elements and the control electrode of the third switching element are connected in common to the signal output terminal, the control electrode of the sixth switching element is connected to the fourth output electrode of said first switching element, and the control electrode of the fifth switching element is connected to the control terminal.

9. A level converting circuit for converting an input signal having a first reference level supplied to a single input terminal into an output signal having a second reference level comprising:

an input switching element of a first conductive type having first and second electrodes and a first control electrode, the first control electrode being coupled to the input signal and the first electrode being coupled to a first voltage level;

an input loading element of a second conductive type opposite the first conductive type and having third and fourth electrodes and a second control electrode, the second control electrode being coupled to a control voltage level, the third electrode being coupled to the second electrode of said input switching element and the fourth electrode being coupled to a second voltage level;

an output loading element of the first conductive type having fifth and sixth electrodes and a third control electrode, the fifth electrode being coupled to a third voltage level and the sixth electrode being coupled to an output terminal of the level converting circuit; and an output switching element of the second conductive type having seventh and eighth electrodes and a fourth control electrode, the fourth control electrode being coupled to the second electrode of said input switching element, the seventh electrode being coupled to the output terminal, and the eighth electrode being coupled to a fourth voltage level, the third control electrode of said output loading element being coupled to a sixth voltage level, the input signal switching between the first and second voltage levels with the first reference level therebetween and the output signal being provided along the output terminal as switching between the third and fourth voltage levels with the second reference level therebetween.

10. A level converting circuit for converting an input signal having a first reference level supplied to a signal input terminal into an output signal having a second reference level comprising:

an input switching element having first and second electrodes and a first control electrode, the first control electrode being coupled to the input signal and the first electrode being coupled to a first voltage level;

an input loading element having third and fourth electrodes and a second control electrode, the second control electrode being coupled to a control voltage level, the third electrode being coupled to the second electrode of said input switching element and the fourth electrode being coupled to a second voltage level; and an output switching element having first and second power terminals, a control terminal and an output terminal, the control terminal being coupled to the second electrode of said input switching element, the first power terminal being coupled to a third voltage level and the second power terminal being coupled to a fourth voltage level, the input signal switching between the first and second voltage levels with the first reference level therebetween and the output signal being provided along the output terminal as switching between the third and fourth voltage levels with the second reference level therebetween.

11. The level converting circuit of claim 10, wherein said output switching element comprises:

a first switching element having fifth and sixth electrodes and a third control electrode, the fifth electrode being coupled to the first power terminal, the sixth electrode being coupled to the output terminal and the third control terminal being coupled to a fifth voltage level; and a second switching element having seventh and eighth electrodes and a fourth control electrode, the seventh electrode being coupled to the output terminal, the eighth electrode being coupled to the second power terminal and the fourth control electrode being coupled to the control terminal.

12. The level converting circuit of claim 11, wherein said input switching element and said first switching element are of a first conductive type and said input loading element and said second switching element are of a second conductive type opposite the first conductive type.

13. The level converting circuit of claim 10, wherein said output switching element comprises:

a first switching element having fifth and sixth electrodes and a third control electrode, the fifth electrode being coupled to the first power terminal, the sixth electrode being coupled to the output terminal and the third control electrode being coupled to the control terminal; and a second switching element having seventh and eighth electrodes and a fourth control electrode, the seventh electrode being coupled to the output terminal, the eighth electrode being coupled to the second power terminal and the fourth control electrode being coupled to the control terminal.

14. The level converting circuit of claim 13, wherein said input switching element and said first switching element are of a first conductive type and said input loading element and said second switching element are of a second conductive type opposite the first conductive type.

15. The level converting circuit of claim 10, wherein said output switching element comprises:

a first switching element having fifth and sixth electrodes and a third control electrode, the fifth electrode being coupled to the first voltage level and the third control electrode being coupled to system ground;

a second switching element having seventh and eighth electrodes and a fourth control electrode, the seventh electrode coupled to the sixth electrode of said first switching element, the eighth electrode being coupled to the second voltage level and the fourth control electrode being coupled to the control terminal;

third and fourth switching elements each having respective ninth and tenth electrodes and a control electrode, the ninth electrodes each being coupled to the first power terminal; and fifth and sixth switching elements each having respective eleventh and twelfth electrodes and a control electrode, the twelfth electrodes each being coupled to the second power terminal, and the control electrode of said fifth switching element being coupled to the control terminal, the tenth and eleventh electrodes of said third and fifth switching elements and the control electrode of said fourth switching element being coupled together, and the tenth and eleventh electrodes of said fourth and sixth switching elements and the control electrode of said third switching element being coupled together to the output terminal.

16. The level converting circuit of claim 15, wherein said input switching element, said first switching element and said third and fourth switching elements are of a first conductive type and said input loading element, said second switching element and said fifth and sixth switching elements are of a second conductive type opposite the first conductive type.

* * * * *

UNITED STATES PATENT AND TRADEMARK OFFICE
CERTIFICATE OF CORRECTION

PATENT NO. : 6,107,857
DATED : August 22, 2000
INVENTOR(S) : Yukihisa Orisaka and Hideki Morii Page 1 of 1

It is certified that error appears in the above-identified patent and that said Letters Patent is hereby corrected as shown below:

Please insert the following information on the cover of the patent

-- Related U.S. Application Data

[63] Continuation-in-part of Ser. No. 08/708,680, September 5, 1996, now abandoned. --

Signed and Sealed this

Tenth Day of July, 2001

*Attest:*

*Attesting Officer*

NICHOLAS P. GODICI
*Acting Director of the United States Patent and Trademark Office*